US012701700B2

(12) United States Patent
Zhang et al.

(10) Patent No.: US 12,701,700 B2
(45) Date of Patent: *Aug. 4, 2026

(54) THREE-DIMENSIONAL MEMORY DEVICES AND METHODS FOR FORMING THE SAME

(71) Applicant: YANGTZE MEMORY TECHNOLOGIES CO., LTD., Wuhan (CN)

(72) Inventors: Kun Zhang, Wuhan (CN); Wenxi Zhou, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 0 days.

This patent is subject to a terminal disclaimer.

(21) Appl. No.: 18/676,298

(22) Filed: May 28, 2024

(65) Prior Publication Data

US 2024/0334690 A1 Oct. 3, 2024

Related U.S. Application Data

(63) Continuation of application No. 17/352,242, filed on Jun. 18, 2021, now Pat. No. 12,310,011, which is a
(Continued)

(51) Int. Cl.
H10B 41/27 (2023.01)
H10B 41/35 (2023.01)
(Continued)

(52) U.S. Cl.
CPC ............. H10B 41/27 (2023.02); H10B 41/35 (2023.02); H10B 41/40 (2023.02); H10B 43/27 (2023.02); H10B 43/35 (2023.02); H10B 43/40 (2023.02)

(58) Field of Classification Search
CPC ........ H10B 41/27; H10B 41/40; H10B 43/27; H10B 43/40; H10B 43/50; H10B 41/35;
(Continued)

(56) References Cited

U.S. PATENT DOCUMENTS

| | | | |
|---|---|---|---|
| 8,846,508 | B1 | 9/2014 | England et al. |
| 9,129,857 | B2 | 9/2015 | Kim et al. |

(Continued)

FOREIGN PATENT DOCUMENTS

| | | |
|---|---|---|
| CN | 107293544 A | 10/2017 |
| CN | 108886040 A | 11/2018 |

(Continued)

OTHER PUBLICATIONS

Extended European Search Report issued in corresponding European Application No. 21932003, mailed on Jul. 25, 2024, 8 pages.
(Continued)

*Primary Examiner* — Mamadou L Diallo
(74) *Attorney, Agent, or Firm* — BAYES PLLC

(57) ABSTRACT

Memory devices and methods for forming the same are disclosed. In certain aspects, a memory device includes a filling layer; a stack structure including interleaved conductive layers and dielectric layers; a channel structure extending through the stack structure and the filling layer. The channel structure includes a memory film and a semiconductor channel. The memory device also includes a doped semiconductor layer in contact with the semiconductor channel. The filling layer is between the doped semiconductor layer and the stack structure. The memory device further includes an insulating layer, and a source contact extending through the insulating layer and in contact with the doped semiconductor layer. The doped semiconductor layer is between the insulating layer and the filling layer.

20 Claims, 21 Drawing Sheets

Related U.S. Application Data continuation of application No. PCT/CN2021/082028, filed on Mar. 22, 2021.

(51) Int. Cl.
*H10B 41/40* (2023.01)
*H10B 43/27* (2023.01)
*H10B 43/35* (2023.01)
*H10B 43/40* (2023.01)

(58) Field of Classification Search
CPC .......... H10B 43/35; H01L 2224/08145; H01L 24/08

See application file for complete search history.

(56) References Cited

U.S. PATENT DOCUMENTS

| | | | |
|---|---|---|---|
| 9,805,805 B1 * | 10/2017 | Zhang | H10B 43/10 |
| 9,824,966 B1 | 11/2017 | Kanakamedala et al. | |
| 9,972,641 B1 * | 5/2018 | Zhang | H01L 29/0847 |
| 10,199,359 B1 | 2/2019 | Sakakibara et al. | |
| 10,553,599 B1 | 2/2020 | Chen et al. | |
| 10,629,613 B1 | 4/2020 | Shimizu et al. | |
| 2010/0309729 A1 | 12/2010 | Chang et al. | |
| 2013/0032878 A1 | 2/2013 | Kim et al. | |
| 2013/0168757 A1 | 7/2013 | Hong | |
| 2014/0126291 A1 | 5/2014 | Mihnea et al. | |
| 2015/0102399 A1 | 4/2015 | Sakuma et al. | |
| 2015/0179660 A1 | 6/2015 | Yada et al. | |
| 2015/0200259 A1 * | 7/2015 | Lim | H01L 29/66666 |
| | | | 257/326 |
| 2016/0204122 A1 * | 7/2016 | Shoji | H10B 43/50 |
| | | | 257/314 |
| 2016/0307915 A1 | 10/2016 | Pang et al. | |
| 2017/0148811 A1 | 5/2017 | Zhang et al. | |
| 2017/0373078 A1 | 12/2017 | Chu et al. | |
| 2018/0102375 A1 | 4/2018 | Pang et al. | |
| 2018/0138193 A1 | 5/2018 | Zhang et al. | |
| 2018/0308559 A1 | 10/2018 | Kim et al. | |
| 2018/0358377 A1 | 12/2018 | Carlson et al. | |
| 2018/0374866 A1 | 12/2018 | Makala et al. | |
| 2019/0006381 A1 | 1/2019 | Nakatsuji et al. | |
| 2019/0088589 A1 | 3/2019 | Zhu et al. | |
| 2019/0123054 A1 | 4/2019 | Chen et al. | |
| 2019/0273088 A1 | 9/2019 | Cui et al. | |
| 2019/0371816 A1 | 12/2019 | Huang et al. | |
| 2020/0098787 A1 | 3/2020 | Kaneko | |
| 2020/0144285 A1 * | 5/2020 | Lee | H10B 43/27 |
| 2020/0243555 A1 | 7/2020 | Hu et al. | |
| 2020/0258816 A1 | 8/2020 | Okina et al. | |
| 2020/0312868 A1 * | 10/2020 | Xiao | H01L 29/42352 |
| 2020/0381446 A1 * | 12/2020 | Choi | H10B 43/27 |
| 2020/0411543 A1 | 12/2020 | Wang et al. | |
| 2021/0005621 A1 | 1/2021 | Hu et al. | |
| 2021/0006333 A1 | 1/2021 | Morton et al. | |
| 2021/0028190 A1 | 1/2021 | Kim et al. | |
| 2021/0057432 A1 | 2/2021 | Lu et al. | |
| 2021/0066458 A1 | 3/2021 | Tak et al. | |
| 2021/0066460 A1 | 3/2021 | Haller | |
| 2021/0399018 A1 | 12/2021 | Zhu | |
| 2022/0037352 A1 * | 2/2022 | Zhang | H10B 41/30 |
| 2022/0045090 A1 | 2/2022 | Cui et al. | |
| 2022/0262805 A1 * | 8/2022 | Tomita | H10B 41/35 |
| 2022/0302149 A1 * | 9/2022 | Zhang | H10B 41/35 |
| 2022/0302151 A1 * | 9/2022 | Zhang | H10B 43/27 |

FOREIGN PATENT DOCUMENTS

| | | | | | |
|---|---|---|---|---|---|
| CN | 109219885 A | 1/2019 | | | |
| CN | 109473445 A | 3/2019 | | | |
| CN | 109755254 A | 5/2019 | | | |
| CN | 110088903 A | 8/2019 | | | |
| CN | 110310957 A | 10/2019 | | | |
| CN | 110402495 A | 11/2019 | | | |
| CN | 110785851 A | 2/2020 | | | |
| CN | 110800106 A | 2/2020 | | | |
| CN | 110867447 A | 3/2020 | | | |
| CN | 110970441 A | 4/2020 | | | |
| CN | 111149206 A | 5/2020 | | | |
| CN | 111162089 A | 5/2020 | | | |
| CN | 111354730 A | 6/2020 | | | |
| CN | 111354739 A | * | 6/2020 | ........ | H01L 27/11556 |
| CN | 111370423 A | | 7/2020 | | |
| CN | 111566816 A | * | 8/2020 | ............ | H01L 24/00 |
| CN | 111755453 A | | 10/2020 | | |
| CN | 111758164 A | * | 10/2020 | ............ | H01L 24/00 |
| CN | 111799265 A | | 10/2020 | | |
| CN | 111801797 A | * | 10/2020 | ........ | H01L 23/5226 |
| CN | 111801798 A | | 10/2020 | | |
| CN | 111801799 A | | 10/2020 | | |
| CN | 111801800 A | * | 10/2020 | ........ | H01L 27/11524 |
| CN | 112018126 A | | 10/2020 | | |
| CN | 111937148 A | | 11/2020 | | |
| CN | 112074956 A | * | 12/2020 | ........ | H01L 27/11521 |
| CN | 112331652 A | | 2/2021 | | |
| CN | 112397523 A | | 2/2021 | | |
| CN | 112424933 A | * | 2/2021 | ............ | H01L 25/18 |
| JP | 2010199314 A | | 9/2010 | | |
| JP | 2019165135 A | | 9/2019 | | |
| JP | 2020526938 A | | 8/2020 | | |
| JP | 2020-527294 A | | 9/2020 | | |
| JP | 2020145233 A | | 9/2020 | | |
| JP | 2021034696 A | | 3/2021 | | |
| KR | 20130037063 A | | 4/2013 | | |
| KR | 20150085735 A | | 7/2015 | | |
| KR | 30270093099 A | | 8/2017 | | |
| KR | 20200011498 A | | 2/2020 | | |
| KR | 20200137806 A | | 12/2020 | | |
| TW | 201601362 A | | 1/2016 | | |
| TW | I582908 B | | 5/2017 | | |
| TW | 201911537 A | | 3/2019 | | |
| TW | 201913958 A | | 4/2019 | | |
| TW | 202025463 A | | 7/2020 | | |
| TW | 202032769 A | | 9/2020 | | |
| TW | 202034513 A | | 9/2020 | | |
| TW | I705557 B | | 9/2020 | | |
| TW | 202101668 A | | 1/2021 | | |
| WO | 2016/093947 A1 | | 6/2016 | | |
| WO | 2019104896 A1 | | 6/2019 | | |
| WO | 2021237492 A1 | | 12/2021 | | |

OTHER PUBLICATIONS

Supplementary European Search Report issued in corresponding European Application No. 21932004.1, dated Oct. 29, 2024,.

Extended European Search Report issued in corresponding European Application No. 21931994, mailed on May 8, 2024, 12 pages.

International Search Report issued in corresponding International Application No. PCT/CN2020/092506, mailed Feb. 26, 2021, 6 pages.

International Search Report issued in corresponding International Application No. PCT/CN2021/081997, mailed Dec. 28, 2021, 4 pages.

International Search Report issued in corresponding International Application No. PCT/CN2021/082028, mailed Dec. 22, 2021, 4 pages.

International Search Report issued in corresponding International Application No. PCT/CN2021/082026, mailed Dec. 27, 2021, 4 pages.

* cited by examiner

<u>100</u>
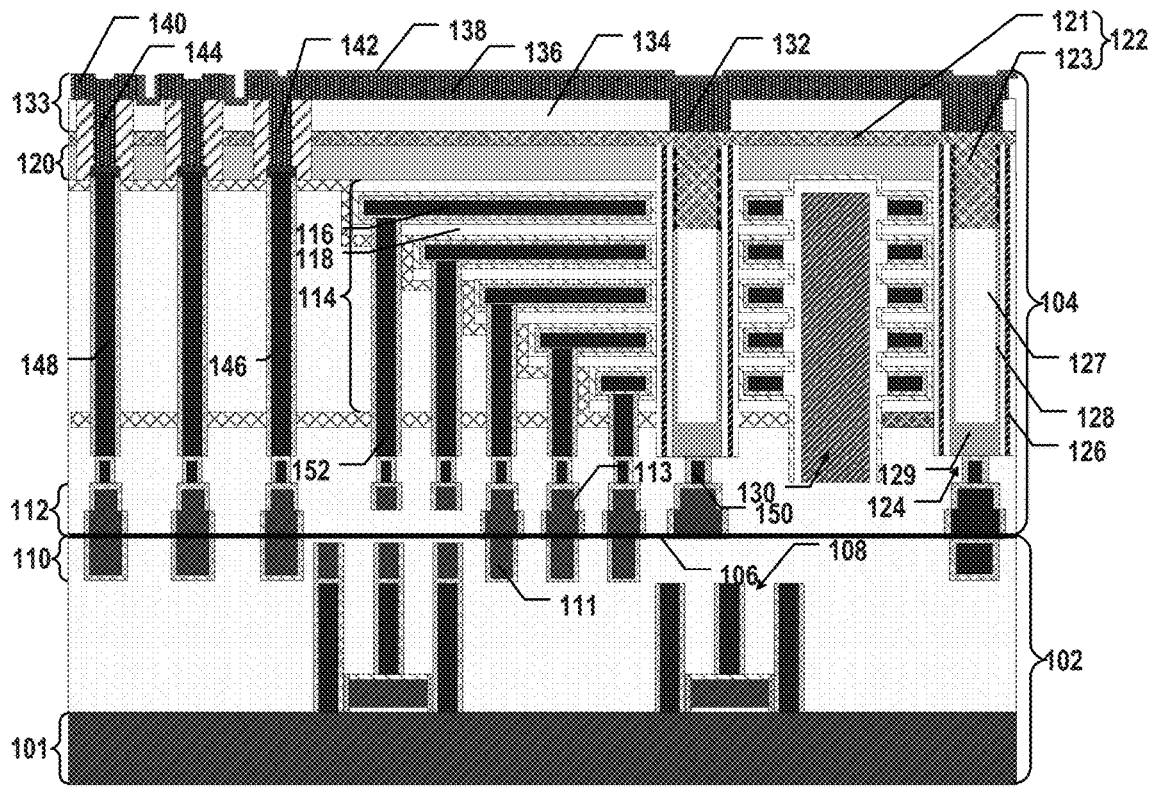
FIG. 1A

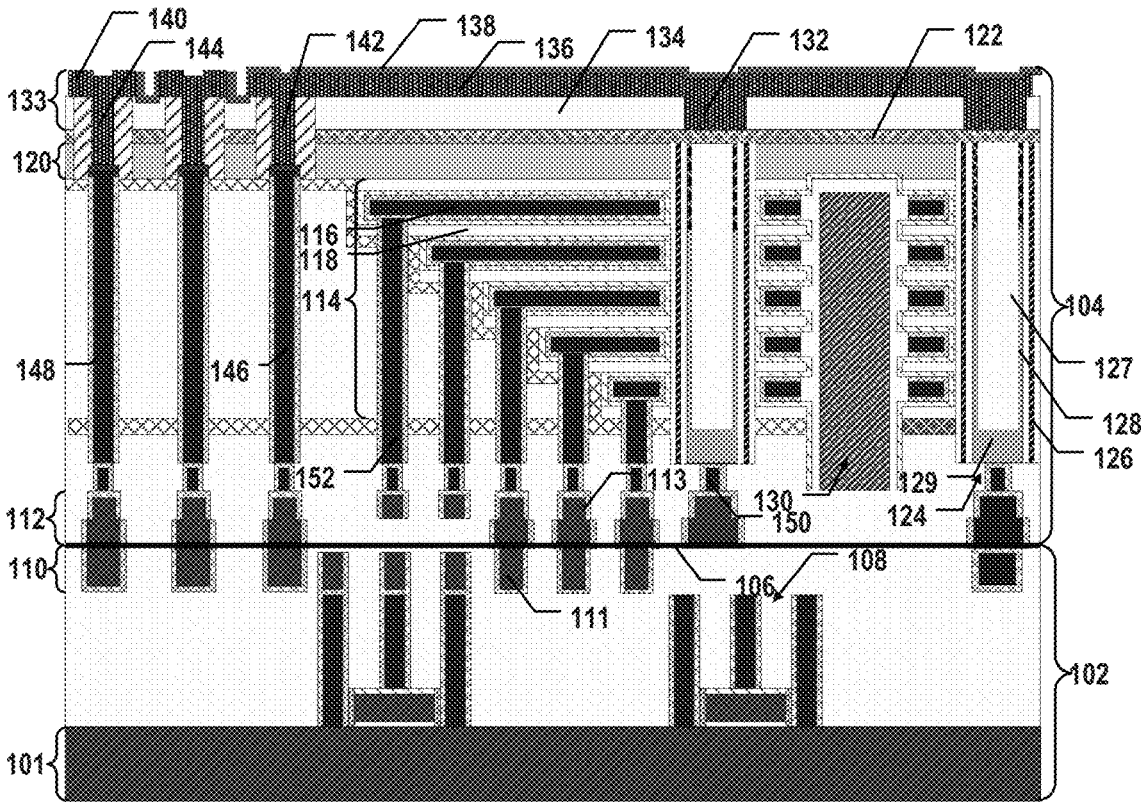
FIG. 1B

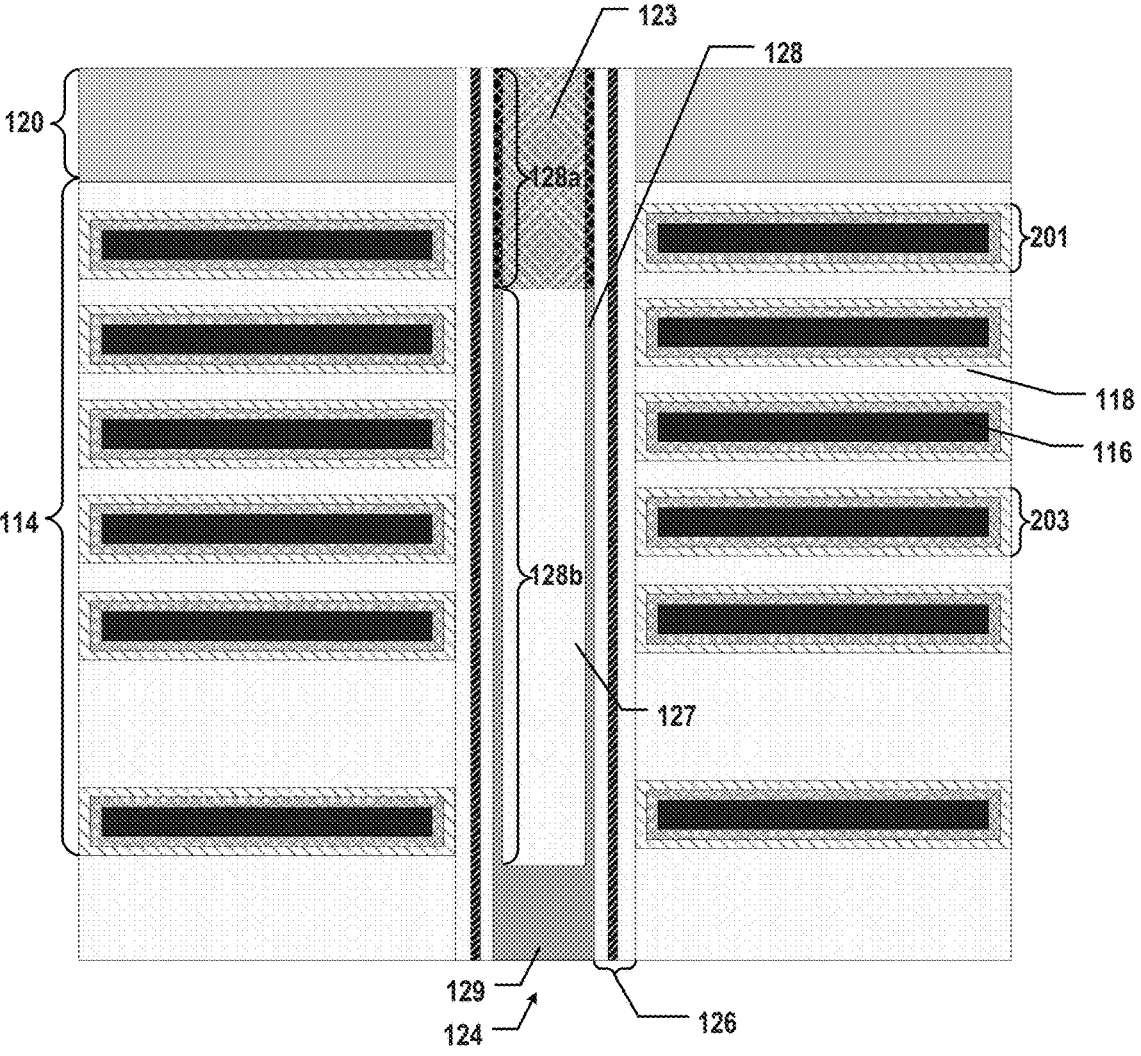
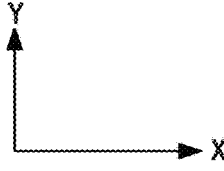
FIG. 2

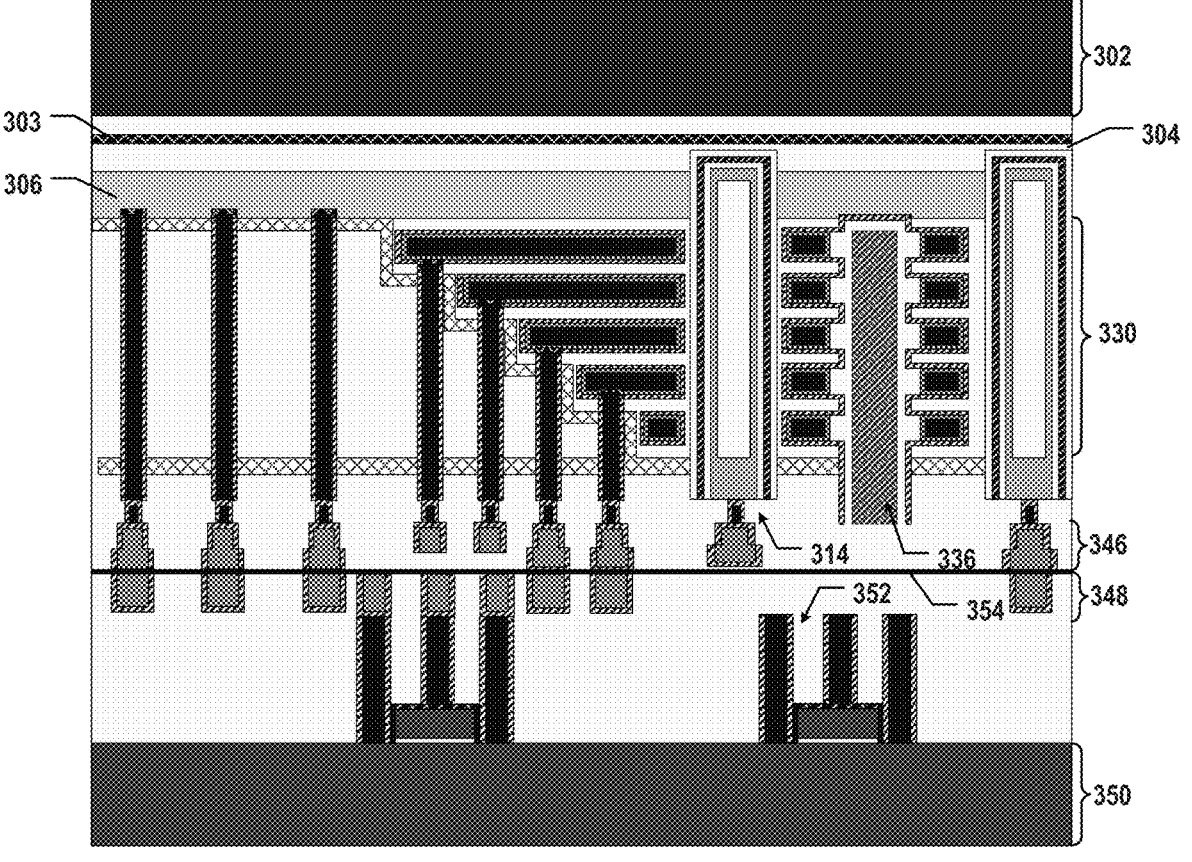
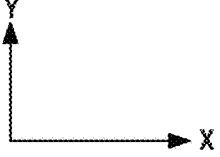
FIG. 3G

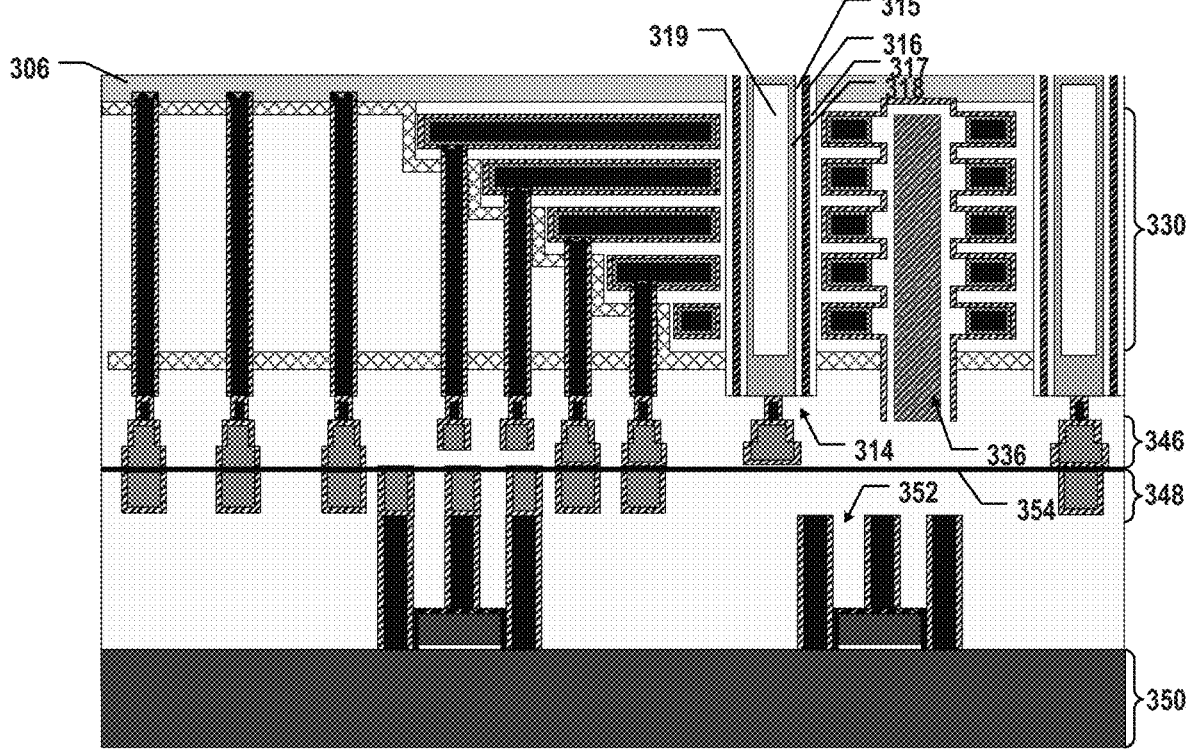
FIG. 3I

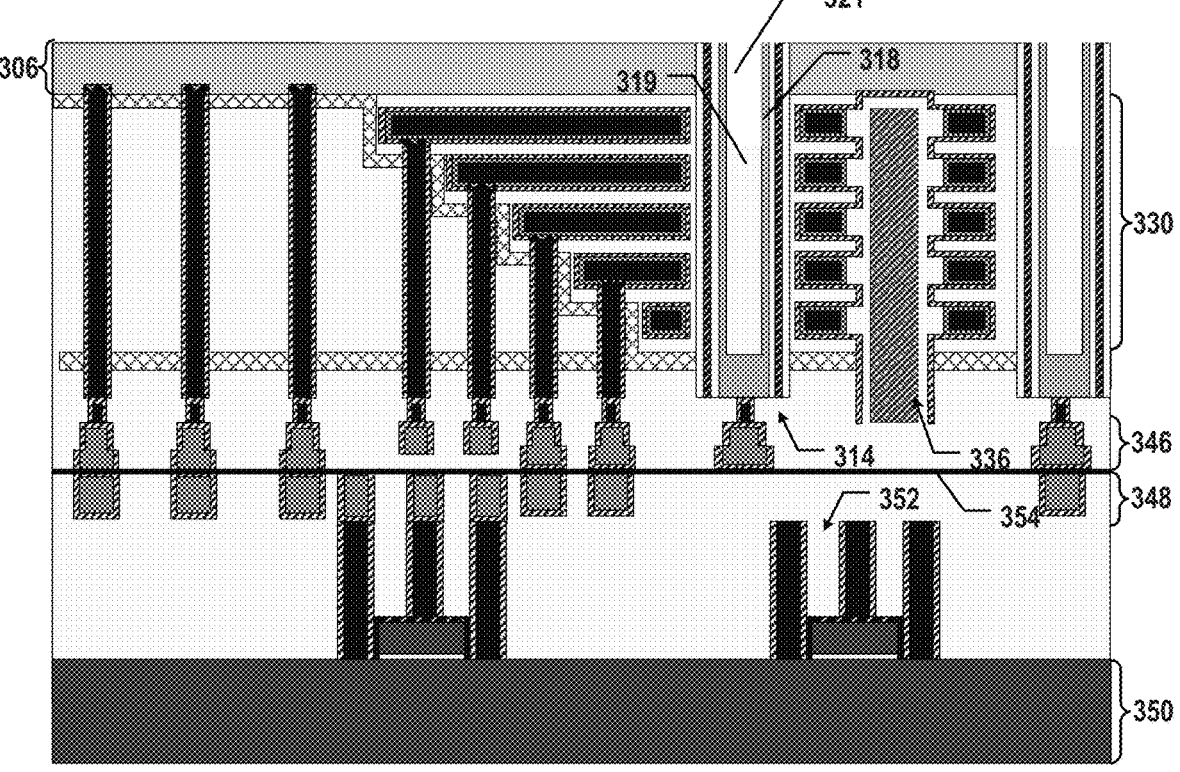
FIG. 3J

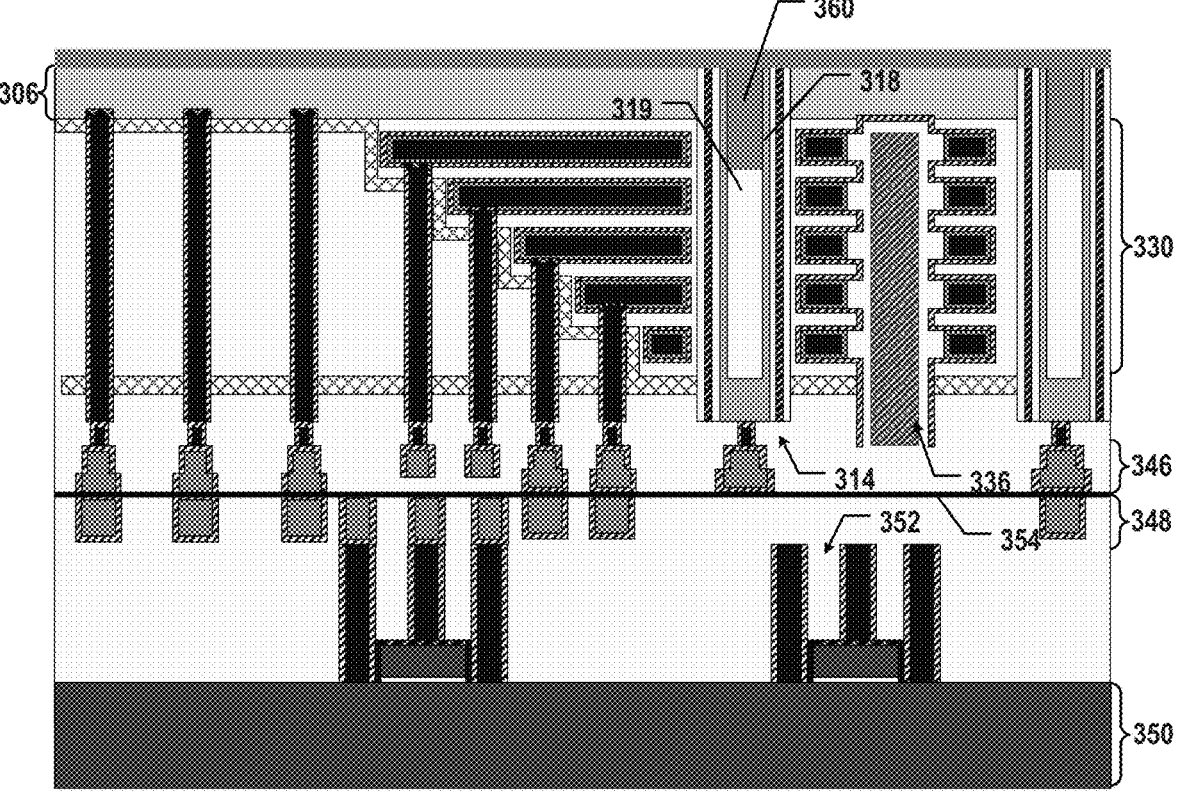
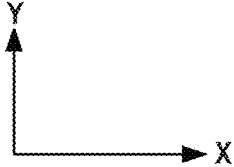
FIG. 3K

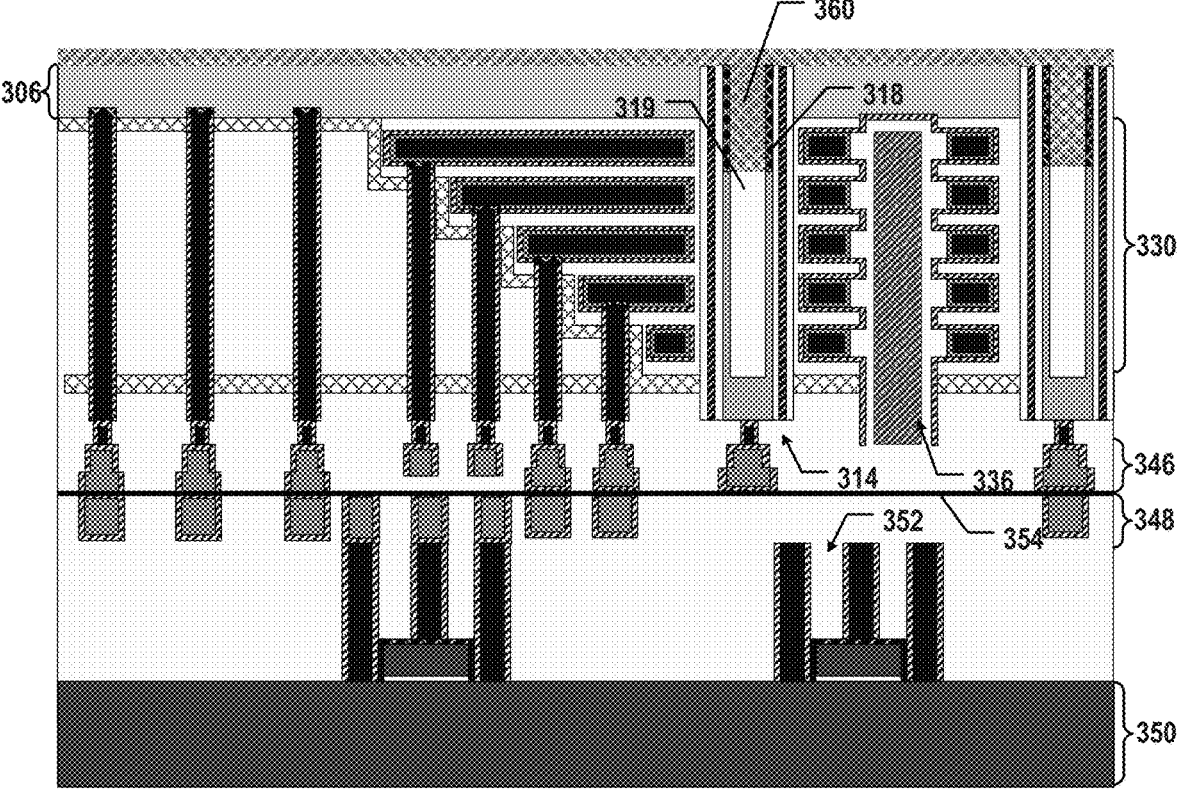
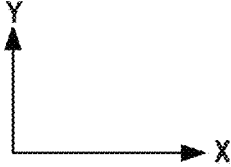
FIG. 3L

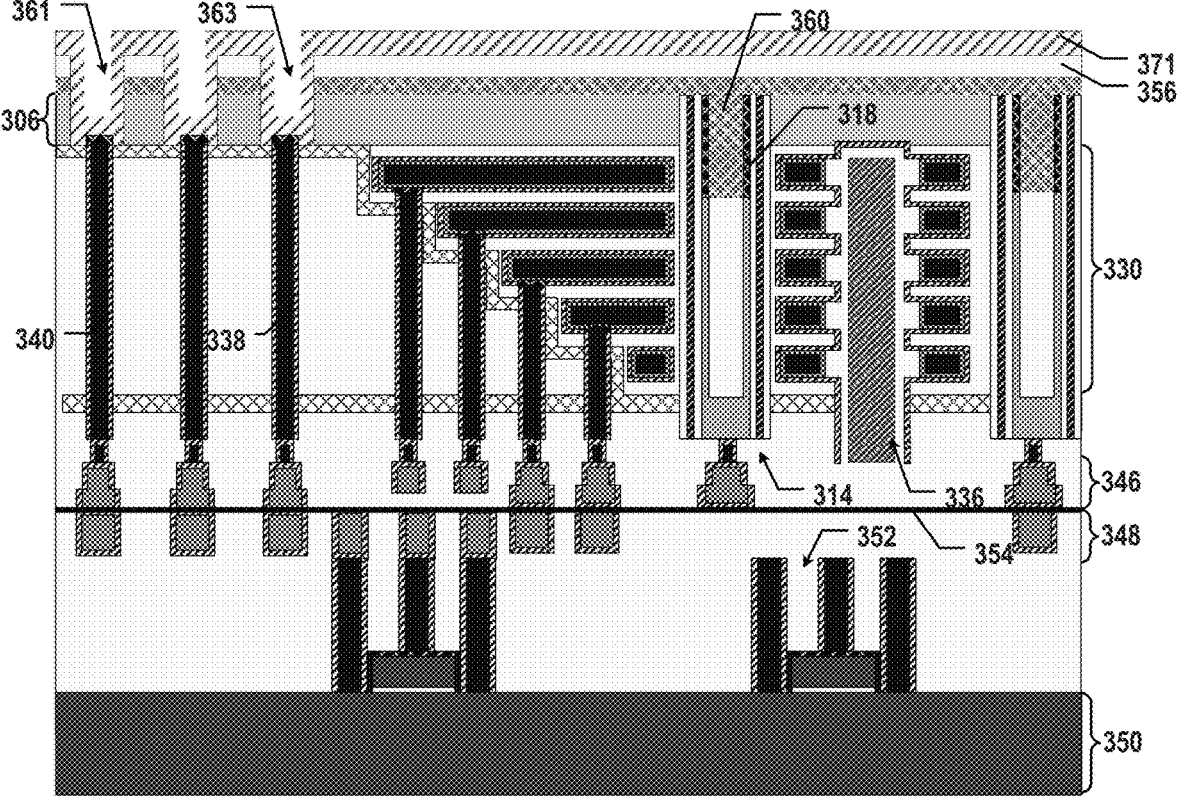
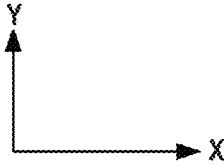
FIG. 3M

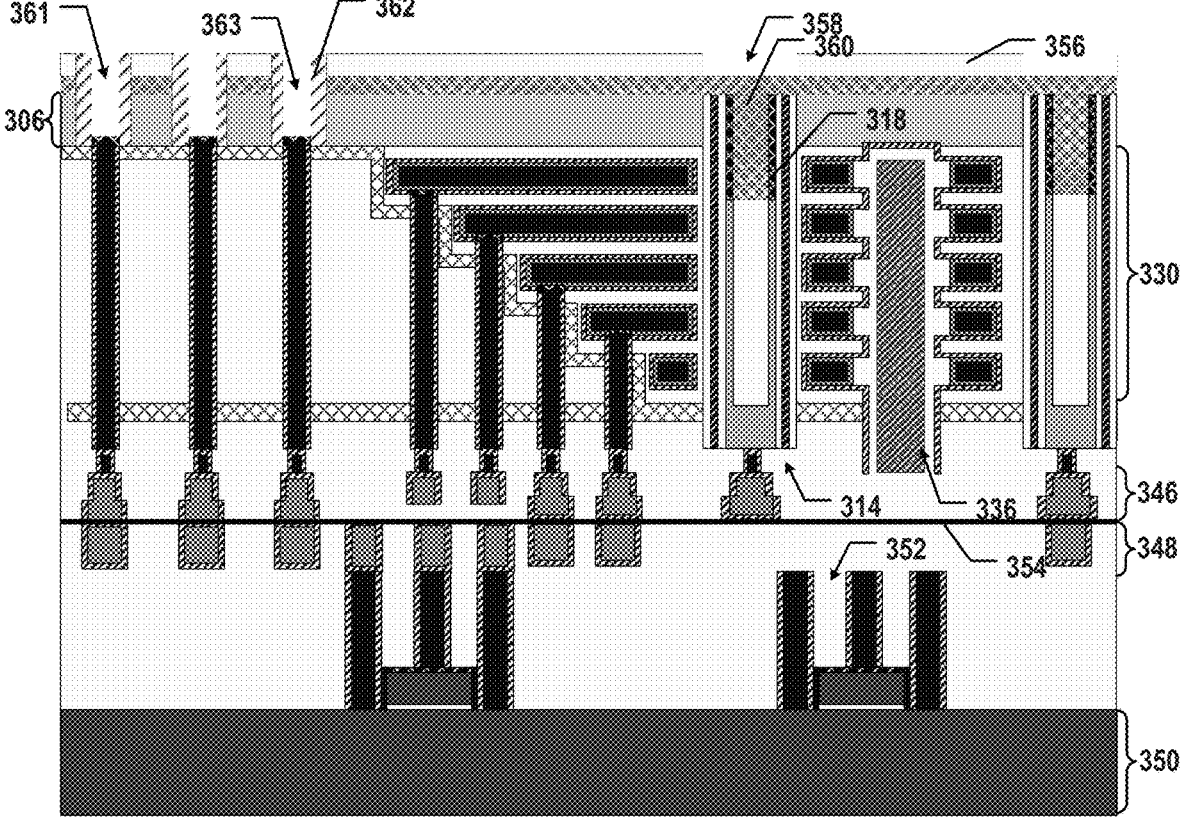
FIG. 3N

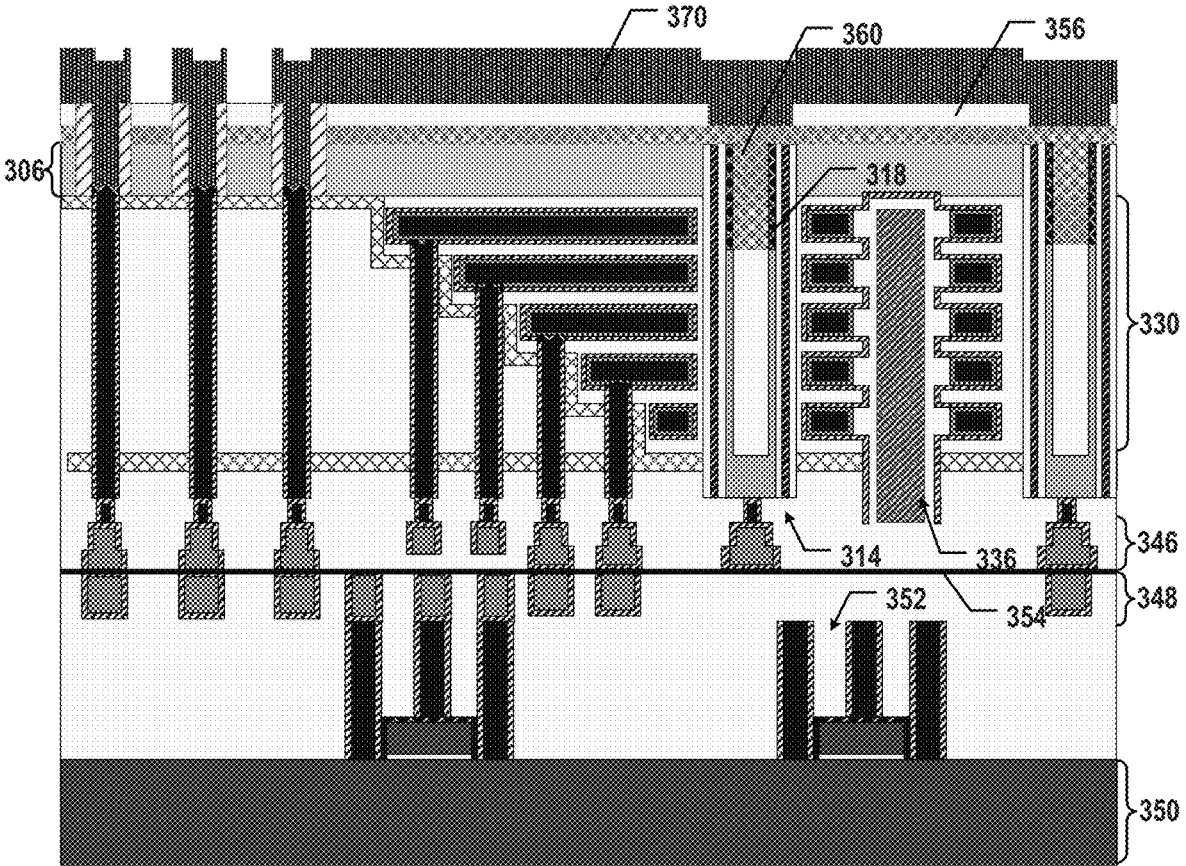
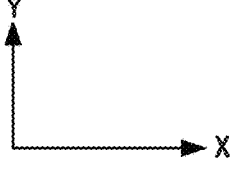
FIG. 3O

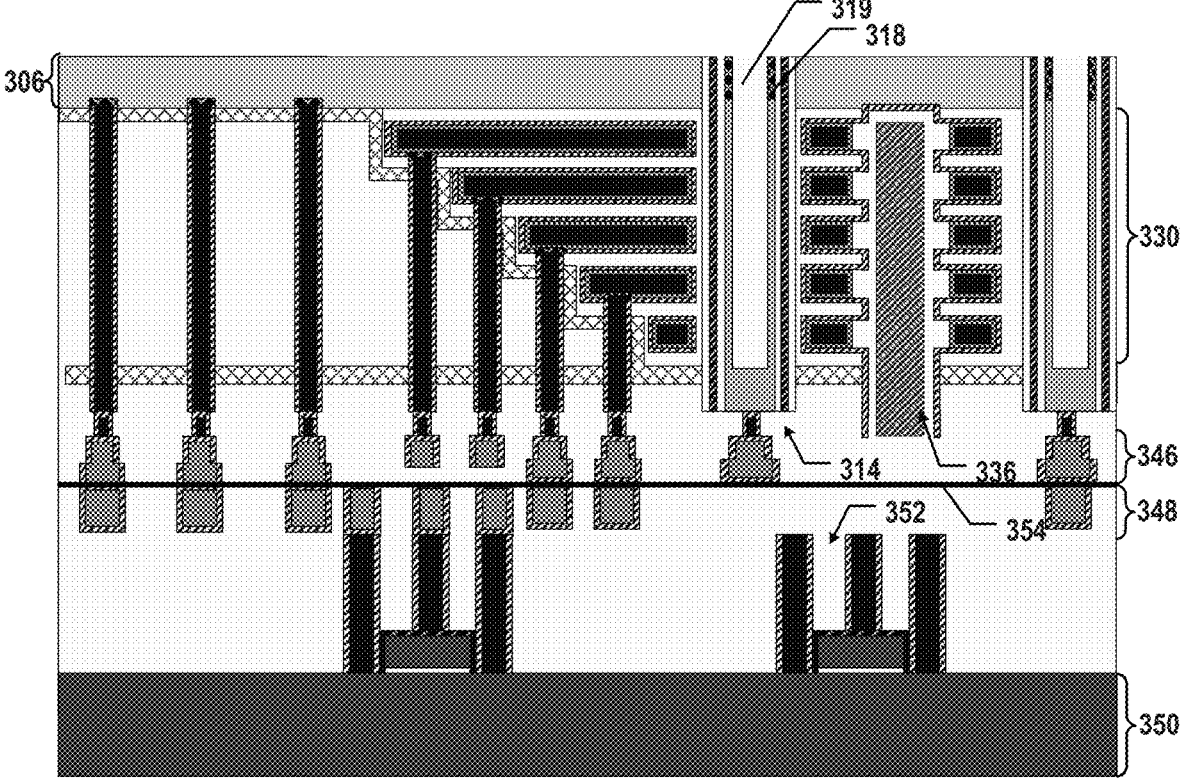
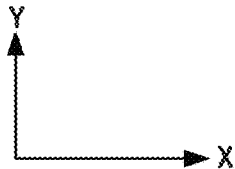
FIG. 4A

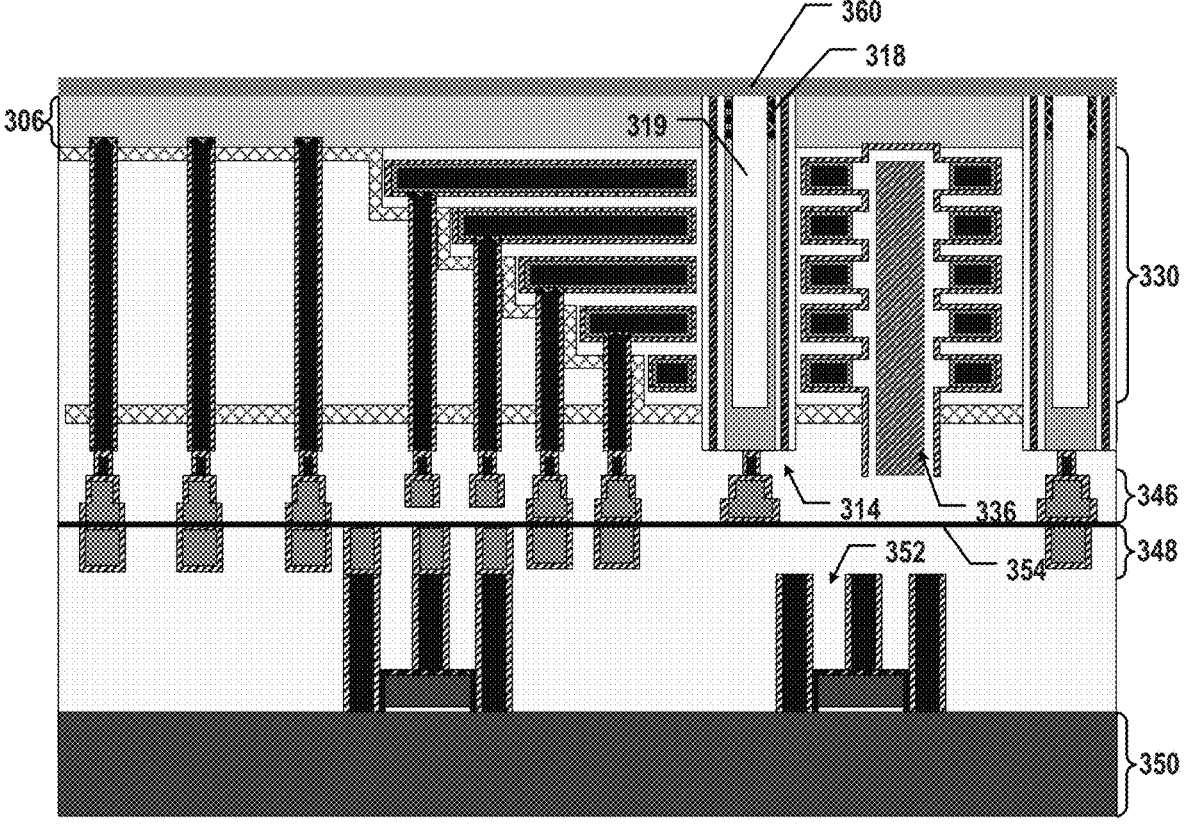
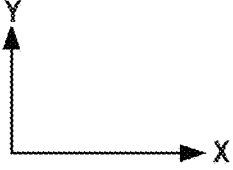
FIG. 4B

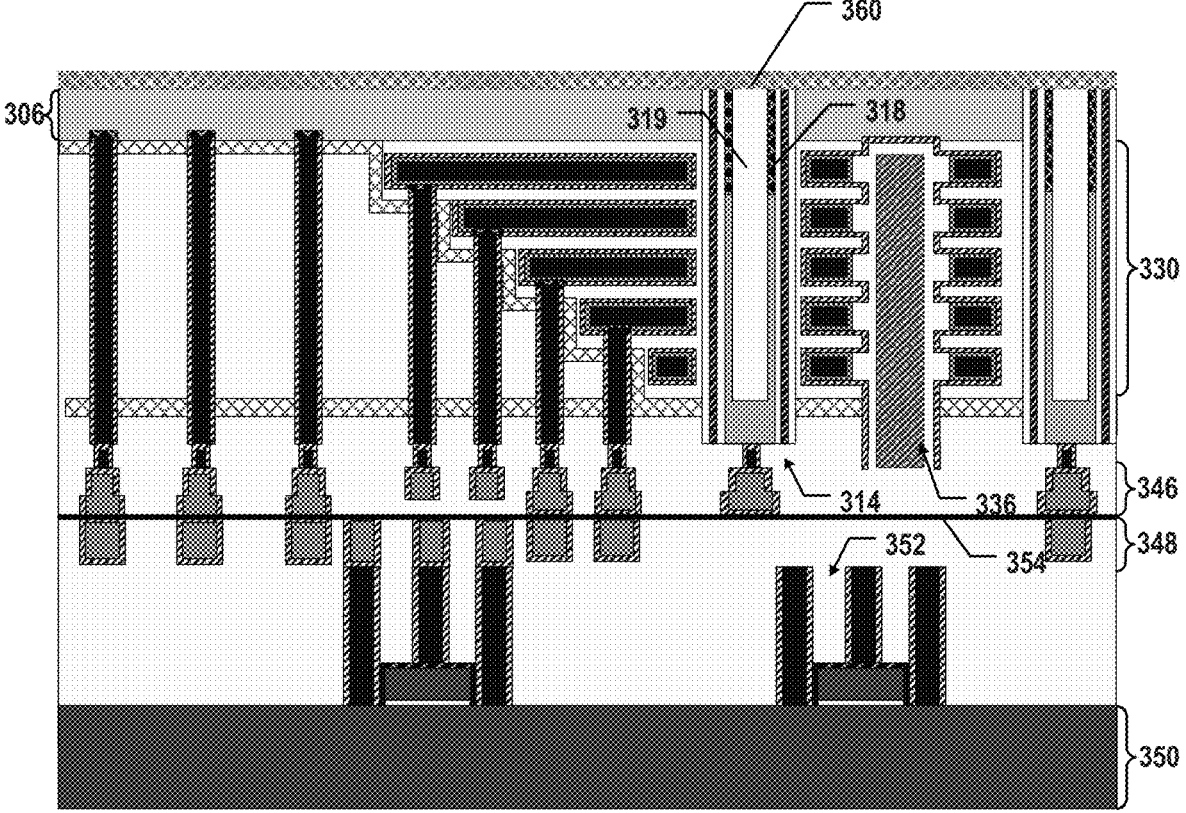
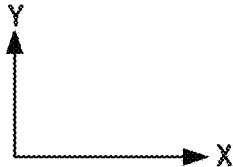
FIG. 4C

<u>500</u>

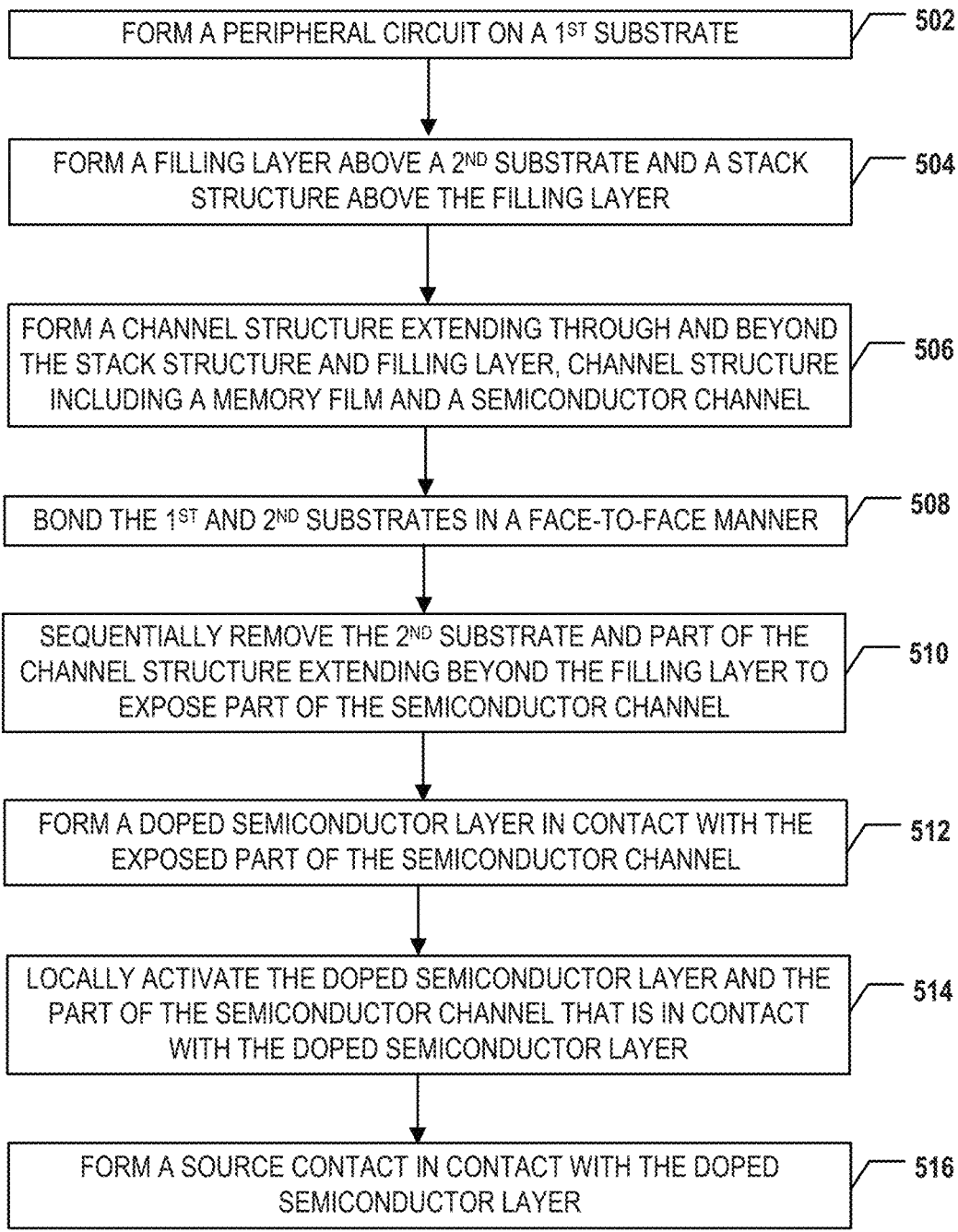

FORM A PERIPHERAL CIRCUIT ON A 1ST SUBSTRATE — 502

FORM A FILLING LAYER ABOVE A 2ND SUBSTRATE AND A STACK STRUCTURE ABOVE THE FILLING LAYER — 504

FORM A CHANNEL STRUCTURE EXTENDING THROUGH AND BEYOND THE STACK STRUCTURE AND FILLING LAYER, CHANNEL STRUCTURE INCLUDING A MEMORY FILM AND A SEMICONDUCTOR CHANNEL — 506

BOND THE 1ST AND 2ND SUBSTRATES IN A FACE-TO-FACE MANNER — 508

SEQUENTIALLY REMOVE THE 2ND SUBSTRATE AND PART OF THE CHANNEL STRUCTURE EXTENDING BEYOND THE FILLING LAYER TO EXPOSE PART OF THE SEMICONDUCTOR CHANNEL — 510

FORM A DOPED SEMICONDUCTOR LAYER IN CONTACT WITH THE EXPOSED PART OF THE SEMICONDUCTOR CHANNEL — 512

LOCALLY ACTIVATE THE DOPED SEMICONDUCTOR LAYER AND THE PART OF THE SEMICONDUCTOR CHANNEL THAT IS IN CONTACT WITH THE DOPED SEMICONDUCTOR LAYER — 514

FORM A SOURCE CONTACT IN CONTACT WITH THE DOPED SEMICONDUCTOR LAYER — 516

THREE-DIMENSIONAL MEMORY DEVICES AND METHODS FOR FORMING THE SAME

CROSS-REFERENCE TO RELATED APPLICATIONS

This application is a continuation U.S. application Ser. No. 17/352,242, filed on Jun. 18, 2021, which is a continuation of International Application No. PCT/CN2021/082028, filed on Mar. 22, 2021, entitled "THREE-DIMENSIONAL MEMORY DEVICES AND METHODS FOR FORMING THE SAME," both of which are hereby incorporated by reference in their entireties. This application is also related to U.S. application Ser. No. 17/352,239, filed on Jun. 18, 2021, entitled "THREE-DIMENSIONAL MEMORY DEVICES AND METHODS FOR FORMING THE SAME," and U.S. application Ser. No. 17/352,244, filed on Jun. 18, 2021, entitled "THREE-DIMENSIONAL MEMORY DEVICES AND METHODS FOR FORMING THE SAME," all of which are hereby incorporated by reference in their entireties.

BACKGROUND

The present disclosure relates to three-dimensional (3D) memory devices and fabrication methods thereof.

Planar memory cells are scaled to smaller sizes by improving process technology, circuit design, programming algorithm, and fabrication process. However, as feature sizes of the memory cells approach a lower limit, planar process and fabrication techniques become challenging and costly. As a result, memory density for planar memory cells approaches an upper limit.

A 3D memory architecture can address the density limitation in planar memory cells. The 3D memory architecture includes a memory array and peripheral devices for controlling signals to and from the memory array.

SUMMARY

In one aspect, a 3D memory device includes a stack structure including interleaved conductive layers and dielectric layers, a channel structure extending through the stack structure, and a doped semiconductor layer including a plate and a plug extending from the plate into the channel structure. The channel structure includes a memory film and a semiconductor channel. The semiconductor channel includes a doped portion, and part of the doped portion of the semiconductor channel extends beyond the stack structure in a first direction. The doped portion of the semiconductor channel circumscribes the plug of the doped semiconductor layer.

In another aspect, a 3D memory device includes a stack structure including interleaved conductive layers and dielectric layers, a doped semiconductor layer, and a channel structure extending through the stack structure. The channel structure includes a memory film and a semiconductor channel. The channel structure includes a memory film and a semiconductor channel. The semiconductor channel includes a doped portion. The channel structure extends beyond the stack structure in a first direction and is in contact with the doped semiconductor layer. The semiconductor channel includes a doped portion extending beyond one of the conductive layers in a second direction opposite to the first direction.

In still another aspect, a method for forming a 3D memory device is provided. A filling layer is formed above a substrate. A stack structure is formed above the filling layer. A channel structure extending through the stack structure and the filling layer is formed. The channel structure includes a memory film and a semiconductor channel. The substrate and part of the channel structure extending beyond the filling layer are sequentially removed to expose part of the semiconductor channel. A doped semiconductor layer is formed in contact with the exposed part of the semiconductor channel. The doped semiconductor layer and the part of the semiconductor channel that is in contact with the doped semiconductor layer are locally activated.

In yet another aspect, a system includes a 3D memory device configured to store data and a memory controller coupled to the 3D memory device and configured to control the 3D memory device. The 3D memory device includes a stack structure including interleaved conductive layers and dielectric layers, a channel structure extending through the stack structure, and a doped semiconductor layer including a plate and a plug extending from the plate into the channel structure. The channel structure includes a memory film and a semiconductor channel. The semiconductor channel includes a doped portion, and part of the doped portion of the semiconductor channel extends beyond the stack structure in a first direction. The doped portion of the semiconductor channel circumscribes the plug of the doped semiconductor layer.

BRIEF DESCRIPTION OF THE DRAWINGS

The accompanying drawings, which are incorporated herein and form a part of the specification, illustrate aspects of the present disclosure and, together with the description, further serve to explain the principles of the present disclosure and to enable a person skilled in the pertinent art to make and use the present disclosure.

FIG. 1A illustrates a side view of a cross-section of an exemplary 3D memory device, according to some aspects of the present disclosure.

FIG. 1B illustrates a side view of a cross-section of another exemplary 3D memory device, according to some aspects of the present disclosure.

FIG. 2 illustrates an enlarged side view of a cross-section of an exemplary channel structure in the 3D memory devices in FIG. 1A, according to some aspects of the present disclosure.

FIGS. 4A-4C illustrate a fabrication process for forming another exemplary 3D memory device, according to some aspects of the present disclosure.

FIG. 5 illustrates a flowchart of an exemplary method for forming a 3D memory device, according to some aspects of the present disclosure.

Figure 3A:
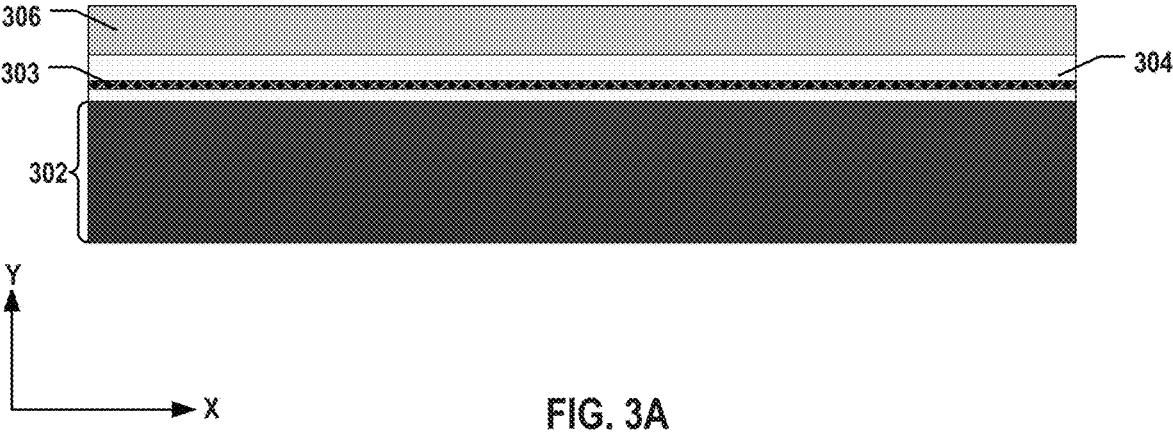
FIGS. 3A-3O illustrate a fabrication process for forming an exemplary 3D memory device, according to some aspects of the present disclosure.

The present disclosure will be described with reference to the accompanying drawings.

DETAILED DESCRIPTION

Although specific configurations and arrangements are discussed, it should be understood that this is done for illustrative purposes only. As such, other configurations and arrangements can be used without departing from the scope of the present disclosure. Also, the present disclosure can also be employed in a variety of other applications. Functional and structural features as described in the present disclosures can be combined, adjusted, and modified with one another and in ways not specifically depicted in the drawings, such that these combinations, adjustments, and modifications are within the scope of the present disclosure.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations), and the spatially relative descriptors used herein may likewise be interpreted accordingly.

As used herein, the term "substrate" refers to a material onto which subsequent material layers are added. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "layer" refers to a material portion including a region with a thickness. A layer can extend over the entirety of an underlying or overlying structure or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend horizontally, vertically, and/or along a tapered surface. A substrate can be a layer, can include one or more layers therein, and/or can have one or more layers thereupon, thereabove, and/or therebelow. A layer can include multiple layers. For example, an interconnect layer can include one or more conductors and contact layers (in which interconnect lines and/or vertical interconnect access (via) contacts are formed) and one or more dielectric layers.

In some 3D NAND memory devices, a semiconductor layer is selectively grown to surround the sidewalls of channel structures, e.g., known as sidewall selective epitaxial growth (SEG). Compared with another type of semiconductor layer that is epitaxial growth at the source end of the channel structures, e.g., bottom SEG, the formation of sidewall SEG avoids the etching of the memory film and the semiconductor channel at the bottom surface of channel holes (a.k.a. SONO punch), thereby increasing the process window, in particular when fabricating 3D NAND memory devices with advanced technologies, such as having 90 or more levels with a multi-deck architecture.

However, because intrinsic (pure, undoped) semiconductor materials, such as intrinsic polysilicon, are used to form the semiconductor channel, a relatively high potential barrier exists between the semiconductor channel and the sidewall SEG or the conductive layer in contact with the semiconductor channel, thereby introducing high contact resistance therebetween. The electric performance of the 3D memory device can be affected by the high contact resistance.

To address the aforementioned issues, the present disclosure introduces a solution in which the contact resistance between the semiconductor channel and the sidewall SEG or the conductive layer can be reduced. In some implementations, the semiconductor channel is partially doped, such that part of the semiconductor channel that forms the source contact is highly doped to lower the potential barrier while leaving another part of the semiconductor channel that forms the memory cells remaining undoped or lowly doped. In some implementations, one end of each channel structure is opened from the backside to expose the doped part of the respective semiconductor channel, and the 3D memory device further includes a doped semiconductor layer electrically connecting the exposed doped parts of the semiconductor channels to further reduce the contact resistance and sheet resistance. For example, the doped semiconductor layer may include a plug extending the channel structure by replacing part of the capping layer of the channel structure to increase the contact area and further reduce contact resistance. As a result, the electric performance of the 3D memory devices can be improved.

Consistent with the scope of the present disclosure, the doped part of the semiconductor channel and the doped semiconductor layer can be locally activated, e.g., through local annealing, to activate the dopants therein without damaging other parts on the device chip that are sensitive to heat, such as the bonding interface and copper interconnects. For example, the heat for activating the dopants may be confined in an area that excludes thermal-sensitive components on the device chip. In some implementations, the local activation process also serves as an in-situ doping process to dope part of the intrinsic semiconductor channel that is in contact with the doped semiconductor layer.

FIG. 1A illustrates a side view of a cross-section of an exemplary 3D memory device 100, according to some aspects of the present disclosure. In some implementations, 3D memory device 100 is a bonded chip including a first semiconductor structure 102 and a second semiconductor structure 104 stacked over first semiconductor structure 102. First and second semiconductor structures 102 and 104 are jointed at a bonding interface 106 therebetween, according to some implementations. As shown in FIG. 1A, first semiconductor structure 102 can include a substrate 101, which can include silicon (e.g., single crystalline silicon, c-Si), silicon germanium (SiGe), gallium arsenide (GaAs), germanium (Ge), silicon-on-insulator (SOI), or any other suitable materials.

First semiconductor structure 102 of 3D memory device 100 can include peripheral circuits 108 on substrate 101. It is noted that x and y axes are included in FIG. 1A to further illustrate the spatial relationship of the components in 3D memory device 100 having substrate 101. Substrate 101 includes two lateral surfaces (e.g., a top surface and a bottom surface) extending laterally in the x-direction (i.e., the lateral direction). As used herein, whether one component (e.g., a layer or a device) is on, above, or below another component (e.g., a layer or a device) of a semiconductor device (e.g., 3D memory device 100) is determined relative to the substrate of the semiconductor device (e.g., substrate 101) in the y-direction (i.e., the vertical direction) when the substrate is positioned in the lowest plane of the semiconductor device in the y-direction. The same notion for describing spatial relationships is applied throughout the present disclosure.

In some implementations, peripheral circuit 108 is configured to control and sense 3D memory device 100. Peripheral circuit 108 can be any suitable digital, analog, and/or mixed-signal control and sensing circuits used for facilitating the operation of 3D memory device 100 including, but not limited to, a page buffer, a decoder (e.g., a row decoder and a column decoder), a sense amplifier, a driver (e.g., a word line driver), a charge pump, a current or voltage reference, or any active or passive components of the circuit (e.g., transistors, diodes, resistors, or capacitors). Peripheral circuit 108 can include transistors formed on substrate 101, in which the entirety or part of the transistors are formed in substrate 101 (e.g., below the top surface of substrate 101) and/or directly on substrate 101. Isolation regions (e.g., shallow trench isolations (STIs)) and doped regions (e.g., source regions and drain regions of the transistors) can be formed in substrate 101 as well. The transistors are high-speed with advanced logic processes (e.g., technology nodes of 90 nm, 65 nm, 45 nm, 32 nm, 28 nm, 20 nm, 16 nm, 14 nm, 10 nm, 7 nm, 5 nm, 3 nm, 2 nm, etc.), according to some implementations. It is understood that in some implementations, peripheral circuit 108 may further include any other circuits compatible with the advanced logic processes including logic circuits, such as processors and programmable logic devices (PLDs), or memory circuits, such as static random-access memory (SRAM) and dynamic RAM (DRAM).

In some implementations, first semiconductor structure 102 of 3D memory device 100 further includes an interconnect layer (not shown) above peripheral circuits 108 to transfer electrical signals to and from peripheral circuits 108. The interconnect layer can include a plurality of interconnects (also referred to herein as contacts), including lateral interconnect lines and vertical interconnect access (VIA) contacts. As used herein, the term interconnects can broadly include any suitable types of interconnects, such as middle-end-of-line (MEOL) interconnects and back-end-of-line (BEOL) interconnects. The interconnect layer can further include one or more interlayer dielectric (ILD) layers (a.k.a.

intermetal dielectric (IMD) layers) in which the interconnect lines and VIA contacts can form. That is, the interconnect layer can include interconnect lines and VIA contacts in multiple ILD layers. The interconnect lines and VIA contacts in the interconnect layer can include conductive materials including, but not limited to, tungsten (W), cobalt (Co), copper (Cu), aluminum (Al), silicides, or any combination thereof. The ILD layers in the interconnect layer can include dielectric materials including, but not limited to, silicon oxide, silicon nitride, silicon oxynitride, low dielectric constant (low-k) dielectrics, or any combination thereof.

As shown in FIG. 1A, first semiconductor structure 102 of 3D memory device 100 can further include a bonding layer 110 at bonding interface 106 and above the interconnect layer and peripheral circuits 108. Bonding layer 110 can include a plurality of bonding contacts 111 and dielectrics electrically isolating bonding contacts 111. Bonding contacts 111 can include conductive materials including, but not limited to, W, Co, Cu, Al, silicides, or any combination thereof. The remaining area of bonding layer 110 can be formed with dielectrics including, but not limited to, silicon oxide, silicon nitride, silicon oxynitride, low-k dielectrics, or any combination thereof. Bonding contacts 111 and surrounding dielectrics in bonding layer 110 can be used for hybrid bonding.

Similarly, as shown in FIG. 1A, second semiconductor structure 104 of 3D memory device 100 can also include a bonding layer 112 at bonding interface 106 and above bonding layer 110 of first semiconductor structure 102. Bonding layer 112 can include a plurality of bonding contacts 113 and dielectrics electrically isolating bonding contacts 113. Bonding contacts 113 can include conductive materials including, but not limited to, W, Co, Cu, Al, silicides, or any combination thereof. The remaining area of bonding layer 112 can be formed with dielectrics including, but not limited to, silicon oxide, silicon nitride, silicon oxynitride, low-k dielectrics, or any combination thereof. Bonding contacts 113 and surrounding dielectrics in bonding layer 112 can be used for hybrid bonding. Bonding contacts 113 are in contact with bonding contacts 111 at bonding interface 106, according to some implementations.

As described below in detail, second semiconductor structure 104 can be bonded on top of first semiconductor structure 102 in a face-to-face manner at bonding interface 106. In some implementations, bonding interface 106 is disposed between bonding layers 110 and 112 as a result of hybrid bonding (also known as "metal/dielectric hybrid bonding"), which is a direct bonding technology (e.g., forming bonding between surfaces without using intermediate layers, such as solder or adhesives) and can obtain metal-metal bonding and dielectric-dielectric bonding simultaneously. In some implementations, bonding interface 106 is the place at which bonding layers 112 and 110 are met and bonded. In practice, bonding interface 106 can be a layer with a certain thickness that includes the top surface of bonding layer 110 of first semiconductor structure 102 and the bottom surface of bonding layer 112 of second semiconductor structure 104.

In some implementations, second semiconductor structure 104 of 3D memory device 100 further includes an interconnect layer (not shown) above bonding layer 112 to transfer electrical signals. The interconnect layer can include a plurality of interconnects, such as MEOL interconnects and BEOL interconnects. The interconnect layer can further include one or more ILD layers in which the interconnect lines and VIA contacts can form. The interconnect lines and VIA contacts in the interconnect layer can include conductive materials including, but not limited to W, Co, Cu, Al, silicides, or any combination thereof. The ILD layers in the interconnect layer can include dielectric materials including, but not limited to, silicon oxide, silicon nitride, silicon oxynitride, low-k dielectrics, or any combination thereof.

In some implementations, 3D memory device 100 is a NAND Flash memory device in which memory cells are provided in the form of an array of NAND memory strings. Each NAND memory string can include a respective channel structure 124. As shown in FIG. 1A, each channel structure 124 can extend vertically through a plurality of pairs each including a stack conductive layer 116 and a stack dielectric layer 118. The interleaved stack conductive layers 116 and stack dielectric layers 118 are part of a memory stack 114. The number of the pairs of stack conductive layers 116 and stack dielectric layers 118 in memory stack 114 determines the number of memory cells in 3D memory device 100. It is understood that in some implementations, memory stack 114 may have a multi-deck architecture (not shown), which includes a plurality of memory decks stacked over one another. The numbers of the pairs of stack conductive layers 116 and stack dielectric layers 118 in each memory deck can be the same or different.

Memory stack 114 can include a plurality of interleaved stack conductive layers 116 and stack dielectric layers 118. Stack conductive layers 116 and stack dielectric layers 118 in memory stack 114 can alternate in the vertical direction. In other words, except the ones at the top or bottom of memory stack 114, each stack conductive layer 116 can be adjoined by two stack dielectric layers 118 on both sides, and each stack dielectric layer 118 can be adjoined by two stack conductive layers 116 on both sides. Stack conductive layers 116 can include conductive materials including, but not limited to, W, Co, Cu, Al, polysilicon, doped silicon, silicides, or any combination thereof. Each stack conductive layer 116 can include a gate electrode (gate line) surrounded by an adhesive layer and a gate dielectric layer. The gate electrode of stack conductive layer 116 can extend laterally as a word line, ending at one or more staircase structures of memory stack 114. Stack dielectric layers 118 can include dielectric materials including, but not limited to, silicon oxide, silicon nitride, silicon oxynitride, or any combination thereof.

As shown in FIG. 1A, second semiconductor structure 104 of 3D memory device 100 can also include a filling layer 120 above memory stack 114. Filling layer 120 can include polysilicon, a high dielectric constant (high-k) dielectric, or a metal. For example, a high-k dielectric may include any dielectric materials having a dielectric constant higher than that of silicon oxide (e.g., k>3.7). Different from some known solutions in which filling layer 120 acts as the sidewall SEGs surrounding channel structures 124 and/or a conductive layer electrically connecting channel structures 124, such as a doped polysilicon layer, filling layer 120 in second semiconductor structure 104 of 3D memory device 100 may not work as the sidewall SEGs and/or the conductive layer and thus, may include materials other than doped polysilicon, such as dielectrics (e.g., high-k dielectrics), metals (e.g., W, Co, Cu, or Al), metal silicides, or undoped polysilicon. It is understood that in some examples, filling layer 120 may include doped polysilicon as well.

In some implementations, each channel structure 124 includes a channel hole filled with a semiconductor layer (e.g., as a semiconductor channel 128) and a composite dielectric layer (e.g., as a memory film 126). In some implementations, semiconductor channel 128 includes silicon, such as amorphous silicon, polysilicon, or single crystalline silicon. In some implementations, memory film 126 is a composite layer including a tunneling layer, a storage layer (also known as a "charge trap layer"), and a blocking layer. As shown in FIG. 1A, the remaining space of the channel hole can be partially filled with a capping layer 127 including dielectric materials, such as silicon oxide, and/or an air gap (not shown). Channel structure 124 can have a cylinder shape (e.g., a pillar shape). The capping layer, semiconductor channel 128, the tunneling layer, storage layer, and blocking layer of memory film 126 are arranged radially from the center toward the outer surface of the pillar in this order, according to some implementations. The tunneling layer can include silicon oxide, silicon oxynitride, or any combination thereof. The storage layer can include silicon nitride, silicon oxynitride, silicon, or any combination thereof. The blocking layer can include silicon oxide, silicon oxynitride, high-k dielectrics, or any combination thereof. In one example, memory film 126 can include a composite layer of silicon oxide/silicon oxynitride/silicon oxide (ONO).

In some implementations, channel structure 124 further includes a channel plug 129 in the bottom portion (e.g., at the lower end) of channel structure 124. As used herein, the upper end of a component (e.g., channel structure 124) is the end farther away from substrate 101 in the y-direction, and the lower end of the component (e.g., channel structure 124) is the end closer to substrate 101 in the y-direction when substrate 101 is positioned in the lowest plane of 3D memory device 100. Channel plug 129 can include semiconductor materials (e.g., polysilicon). In some implementations, channel plug 129 functions as the drain of channel structure 124.

As shown in FIG. 1A, each channel structure 124 can extend vertically through interleaved stack conductive layers 116 and stack dielectric layers 118 of memory stack 114 into filling layer 120. That is, channel structure 124 can extend beyond memory stack 114 in the positive y-direction. The upper end of memory film 126 is flush with the upper end of semiconductor channel 128, i.e., aligned with one another in the vertical direction, according to some implementations. In some implementations, the upper ends of memory film 126 and semiconductor channel 128 are flush with the top surface of filling layer 120.

Also referred to the enlarged side view of channel structure 124 in FIG. 2, semiconductor channel 128 can include a doped portion 128a and an undoped portion 128b. In some implementations, at least part of doped portion 128a of semiconductor channel 128 extends beyond memory stack 114 in a first direction (e.g., the positive y-direction in FIG. 2). That is, the upper end of doped portion 128a can be above the interface between filling layer 120 and memory stack 114, i.e., the bottom surface of filling layer 120 and the top surface of memory stack 114. Similarly, the upper end of memory film 126 can be above the interface between filling layer 120 and memory stack 114 as well. In some implementations, doped portion 128a of semiconductor channel 128 also extends beyond one of stack conductive layers 116 in a second direction opposite to the first direction (e.g., the negative y-direction in FIG. 2). It is understood that one or more of stack conductive layers 116 that are close to filling layer 120 may be source select gate line 201 (SSG line, sometimes referred to as bottom select gate (BSG) line), and the rest of stack conductive layer 116 may include word lines 203. Doped portion 128a of semiconductor channel 128 also extends beyond a source select gate line 201 that is closest to filling layer 120, according to some implementations. It is understood that if second semiconductor structure 104 of 3D memory device 100 includes more than one source select gate line 201, doped portion 128a may extend beyond all source select gate lines 201. On the other hand, doped portion 128a may not extend further to face word lines 203. That is, the lower end of doped portion 128a is between source select gate lines 201 and word lines 203 in the vertical direction, according to some implementations. For example, as shown in FIG. 2, part of doped portion 128a of semiconductor channel 128 that extends beyond memory stack 114 may face filling layer 120, while the remainder of doped portion 128a may face source select gate line(s) 201.

In some implementations, doped portion 128a of semiconductor channel 128 includes N-type doped polysilicon. The dopant can be any suitable N-type dopants, such as phosphorus (P), arsenic (Ar), or antimony (Sb), which contribute free electrons and increase the conductivity of the intrinsic semiconductor. In some implementations, the doping concentration of doped portion 128a is between about $10^{19}$ cm$^{-3}$ and about $10^{21}$ cm$^{-3}$, such as between $10^{19}$ cm$^{-3}$ and $10^{21}$ cm$^{-3}$ (e.g., $10^{19}$ cm$^{-3}$, $2\times10^{19}$ cm$^{-3}$, $3\times10^{19}$ cm$^{-3}$, $4\times10^{19}$ cm$^{-3}$, $5\times10^{19}$ cm$^{-3}$, $6\times10^{19}$ cm$^{-3}$, $7\times10^{19}$ cm$^{-3}$, $8\times10^{19}$ cm$^{-3}$, $9\times10^{19}$ cm$^{-3}$, $10^{20}$ cm$^{-3}$, $2\times10^{20}$ cm$^{-3}$, $3\times10^{20}$ cm$^{-3}$, $4\times10^{20}$ cm$^{-3}$, $5\times10^{20}$ cm$^{-3}$, $6\times10^{20}$ cm$^{-3}$, $7\times10^{20}$ cm$^{-3}$, $8\times10^{20}$ cm$^{-3}$, $9\times10^{20}$ cm$^{-3}$, $10^{21}$ cm$^{-3}$, any range bounded by the lower end by any of these values, or in any range defined by any two of these values). The doping concentrations of doped portion 128a disclosed herein can significantly reduce the contact resistance between semiconductor channel 128 and a doped semiconductor layer 122 compared with intrinsic semiconductors. It is understood that in some examples, the diffusion of the dopant may be confined in doped portion 128a of semiconductor channel 128, such that the rest of semiconductor channel 128, i.e., the part that faces word lines 203, is undoped portion 128b that still includes intrinsic semiconductor, such as intrinsic polysilicon (i.e., the doping concentration is nominally zero). The doping concentration profile described above can reduce the potential barrier, the contact resistance, and the sheet resistance at doped portion 128a of semiconductor channel 128, which makes electrical connections for the source of the corresponding NAND memory string, without altering the intrinsic nature of undoped portion 128b of semiconductor channel 128 that forms the memory cells of the NAND memory string.

In some implementations, second semiconductor structure 104 of 3D memory device 100 includes doped semiconductor layer 122. Each channel structure 124 can extend beyond memory stack 114 in the first direction and be in contact with doped semiconductor layer 122. In some embodiments, at least part of doped portion 128a of each semiconductor channel 128 extends beyond memory stack 114 in the first direction and is in contact with doped semiconductor layer 122, such that doped semiconductor layer 122 can electrically connect multiple channel structures 124 through their doped portions 128a of semiconductor channels 128. For example, doped semiconductor layer 122 may provide electrical connections between the sources of an array of NAND memory strings in the same block, i.e., the array common source (ACS), with or without filling layer 120 (depending on whether filling layer 120 is conductive or not). In other words, filling layer 120 may not have to include conductive materials, such as metals or doped polysilicon, as doped semiconductor layer 122 alone can electrically connect the sources of multiple NAND memory strings. As a result, the material and dimension constraints on filling layer 120 can be relaxed.

As shown in FIG. 1A, in some implementations, doped semiconductor layer 122 includes two portions: a plate 121 in contact with filling layer 120, and plugs 123 each extending from plate 121 into channel structure 124. Also referred to FIG. 2, doped portion 128a of semiconductor channel 128 circumscribes plug 123 of doped semiconductor layer 122, according to some embodiments. As described below in detail with respect to the fabrication of 3D memory device 100, part of the channel hole in which channel structure 124 is formed can be filled with plug 123, which replaces part of capping layer 127 in the channel hole, such that doped portion 128a of semiconductor channel 128 can surround and be in contact with plug 123 in the lateral direction. Also, plug 123 of doped semiconductor layer 122 can be in contact with capping layer 127 in the vertical direction. As shown in FIG. 2, in some implementations, plug 123 protrudes into channel structure 124, such that the lower end of plug 123 (and the upper end of capping layer 127) is below the interface between filling layer 120 and memory stack 114. That is, capping layer 127 does not extend beyond memory stack 114 due to the existent of plug 123, according to some embodiments.

Similar to doped portion 128a of semiconductor channel 128, plug 123 of doped semiconductor layer 122 also extends beyond one of stack conductive layers 116 in the second direction (e.g., the negative y-direction in FIGS. 1A and 2). Plug 123 also extends beyond source select gate line 201 that is closest to filling layer 120, according to some implementations. It is understood that if second semiconductor structure 104 of 3D memory device 100 includes more than one source select gate line 201, plug 123 may extend beyond all source select gate lines 201. In some embodiments, plug 123 is aligned with doped portion 128a of semiconductor channel 128 in the vertical direction. That is, the upper ends of plug 123 and doped portion 128a of semiconductor channel 128 can be flush with one another, and the lower ends of plug 123 and doped portion 128a of semiconductor channel 128 can be flush with one another as well. As described below in detail with respect to the fabrication of 3D memory device 100, plug 123 can act as the doping source to form doped portion 128a of semiconductor channel 128, such that only that part of semiconductor channel 128 that is in contact with plug 123 is doped by plug 123, forming doped portion 128a of semiconductor channel 128. It is understood that in some examples, part of semiconductor channel 128 may be doped prior to the formation of plug 123, such that the lower ends of plug 123 and doped portion 128a of semiconductor channel 128 may not be flush with one another.

As shown in FIG. 1A, plate 121 of doped semiconductor layer 122 is above and in contact with filling layer 120 as well as memory film 126 of channel structure 124, according to some embodiments. In other words, memory film 126 can extend beyond memory stack 114 in the first direction (e.g., the positive y-direction) and is in contact with plate 121 of doped semiconductor layer 122, and filling layer 120 can be formed between memory stack 114 and plate 121 of doped semiconductor layer 122. By extending laterally above multiple channel structures 124, plate 121 can connect multiple plugs 123, each of which protrudes into a respective channel structure 124.

As described below in detail, the formation of memory stack 114 and the formation of doped portion 128a of semiconductor channel 128 and doped semiconductor layer 122 can occur at opposite sides of filling layer 120, thereby avoiding any deposition or etching process through openings extending through memory stack 114, thereby reducing the fabrication complexity and cost and increasing the yield and vertical scalability.

Similar to doped portion 128a of semiconductor channel 128, in some implementations, doped semiconductor layer 122 (including plate 121 and plugs 123) also includes N-type doped polysilicon. The dopant can be any suitable N-type dopants, such as P, Ar, or Sb, which contribute free electrons and increase the conductivity of the intrinsic semiconductor. Similar to doped portion 128a of semiconductor channel 128, in some implementations, the doping concentration of doped semiconductor layer 122 is between about $10^{19}$ cm$^{-3}$ and about $10^{21}$ cm$^{-3}$, such as between $10^{19}$ cm$^{-3}$ and $10^{21}$ cm$^{-3}$ (e.g., $10^{19}$ cm$^{-3}$, $2 \times 10^{19}$ cm$^{-3}$, $3 \times 10^{19}$ cm$^{-3}$, $4 \times 10^{19}$ cm$^{-3}$, $5 \times 10^{19}$ cm$^{-3}$, $6 \times 10^{19}$ cm$^{-3}$, $7 \times 10^{19}$ cm$^{-3}$, $8 \times 10^{19}$ cm$^{-3}$, $9 \times 10^{19}$ cm$^{-3}$, $10^{20}$ cm$^{-3}$, $2 \times 10^{20}$ cm$^{-3}$, $3 \times 10^{20}$ cm$^{-3}$, $4 \times 10^{20}$ cm$^{-3}$, $5 \times 10^{20}$ cm$^{-3}$, $6 \times 10^{20}$ cm$^{-3}$, $7 \times 10^{20}$ cm$^{-3}$, $8 \times 10^{20}$ cm$^{-3}$, $9 \times 10^{20}$ cm$^{-3}$, $10^{21}$ cm$^{-3}$, any range bounded by the lower end by any of these values, or in any range defined by any two of these values). The doping concentrations of doped semiconductor layer 122 disclosed herein can significantly reduce the contact resistance between semiconductor channel 128 and doped semiconductor channel 122 as well as the sheet resistance of doped semiconductor layer 122, compared with intrinsic semiconductors. As described below in detail, in some implementations, doped portion 128a of semiconductor channel 128 and doped semiconductor layer 122 have the same material (e.g., N-type doped polysilicon) with the same dopant as well as a continuous doping profile due to the same local activation process performed thereon. Thus, it is understood that the interface and boundary between doped portion 128a of semiconductor channel 128 and plug 123 of doped semiconductor layer 122 may become indistinguishable and thus cannot be discerned in 3D memory device 100.

By doping and contacting semiconductor channel 128 and doped semiconductor layer 122, the contact resistance between the NAND memory strings (i.e., at the ACS of NAND memory strings in the same block) can be reduced, thereby improving the electrical performance of 3D memory device 100. As shown in FIGS. 1A and 2, by extending plug 123 into channel structure 124, doped portion 128a of semiconductor channel 128 can circumscribe plug 123 of doped semiconductor layer 122, thereby increasing the contact area between semiconductor channel 128 and doped semiconductor layer 122, which further reduces the contact resistance therebetween. Plug 123 of N-type doped semiconductor layer 122, which is surrounded by doped portion 128a of semiconductor channel 128, can enable gate-induced drain leakage (GIDL)-assisted body biasing for erase operations for 3D memory device 100. The GIDL around source select gate line(s) 201 can generate hole current (i.e., source leakage current) into semiconductor channel 128 from the source of the corresponding NAND memory string to raise the body potential for erase operations. That is, plug 123 of N-type doped semiconductor layer 122 is configured to generate GIDL-assisted body biasing when performing an erase operation, according to some implementations. In some implementations, by also doping part of semiconductor channel 128 facing source select gate line(s) 201, the GIDL effect can be further enhanced.

As shown in FIG. 1A, second semiconductor structure 104 of 3D memory device 100 can further include insulating structures 130 each extending vertically through interleaved stack conductive layers 116 and stack dielectric layers 118 of memory stack 114. Different from channel structure 124 that extends further into filling layer 120, insulating structures 130 stops at the bottom surface of filling layer 120, i.e., does not extend vertically into filling layer 120, according to some implementations. That is, the top surface of insulating structure 130 can be flush with the bottom surface of filling layer 120. Each insulating structure 130 can also extend laterally to separate channel structures 124 into a plurality of blocks. That is, memory stack 114 can be divided into a plurality of memory blocks by insulating structures 130, such that the array of channel structures 124 can be separated into each memory block. Different from the slit structures in existing 3D NAND memory devices, which include front side ACS contacts, insulating structure 130 does not include any contact therein (i.e., not functioning as the source contact) and thus, does not introduce parasitic capacitance and leakage current with stack conductive layers 116, according to some implementations. In some implementations, each insulating structure 130 includes an opening (e.g., a slit) filled with one or more dielectric materials, including, but not limited to, silicon oxide, silicon nitride, silicon oxynitride, or any combination thereof. In one example, each insulating structure 130 may be filled with silicon oxide. It is understood that in some examples (as shown in FIG. 1A), insulating structure 130 may be partially filled with non-dielectric materials, such as polysilicon, to adjust the mechanical properties, e.g., the hardness and/or stress, of insulating structure 130.

Moreover, as described below in detail, because the opening for forming insulating structure 130 is not used for forming doped semiconductor layer 122 and doped portion 128a of semiconductor channel 128, the increased aspect ratio of the opening (e.g., greater than 50) as the number of interleaved stack conductive layers 116 and stack dielectric layers 118 increases would not affect the formation of doped semiconductor layer 122 and doped portion 128a of semiconductor channel 128.

Instead of the front side source contacts, 3D memory device 100 can include one or more backside source contacts 132 above and in contact with doped semiconductor layer 122, as shown in FIG. 1A. Source contact 132 and memory stack 114 (and insulating structure 130 therethrough) can be disposed at opposite sides of filling layer 120 and thus, viewed as a "backside" source contact. In some implementations, source contact 132 is electrically connected to semiconductor channel 128 of channel structure 124 through doped semiconductor layer 122. Source contacts 132 can include any suitable types of contacts. In some implementations, source contacts 132 include a VIA contact. In some implementations, source contacts 132 include a wall-shaped contact extending laterally. Source contact 132 can include one or more conductive layers, such as a metal layer (e.g., W, Co, Cu, or Al) or a silicide layer surrounded by an adhesive layer (e.g., titanium nitride (TiN)).

Figure 3B:
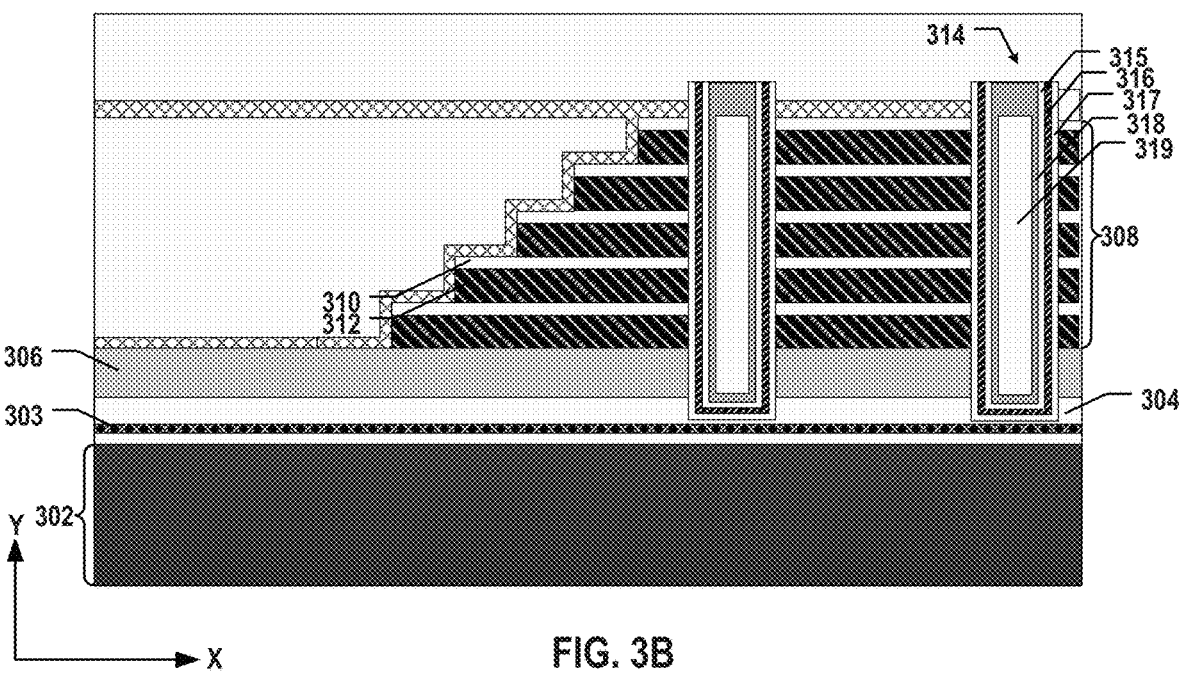
Figure 3C:
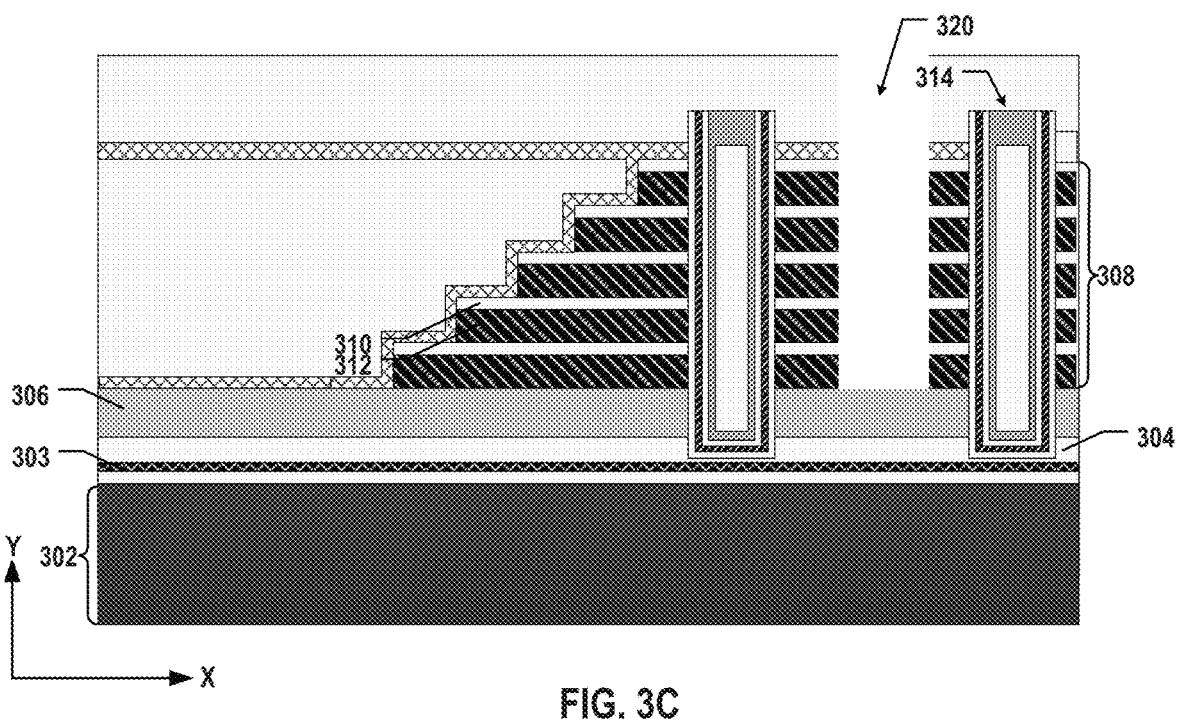
Figure 3D:
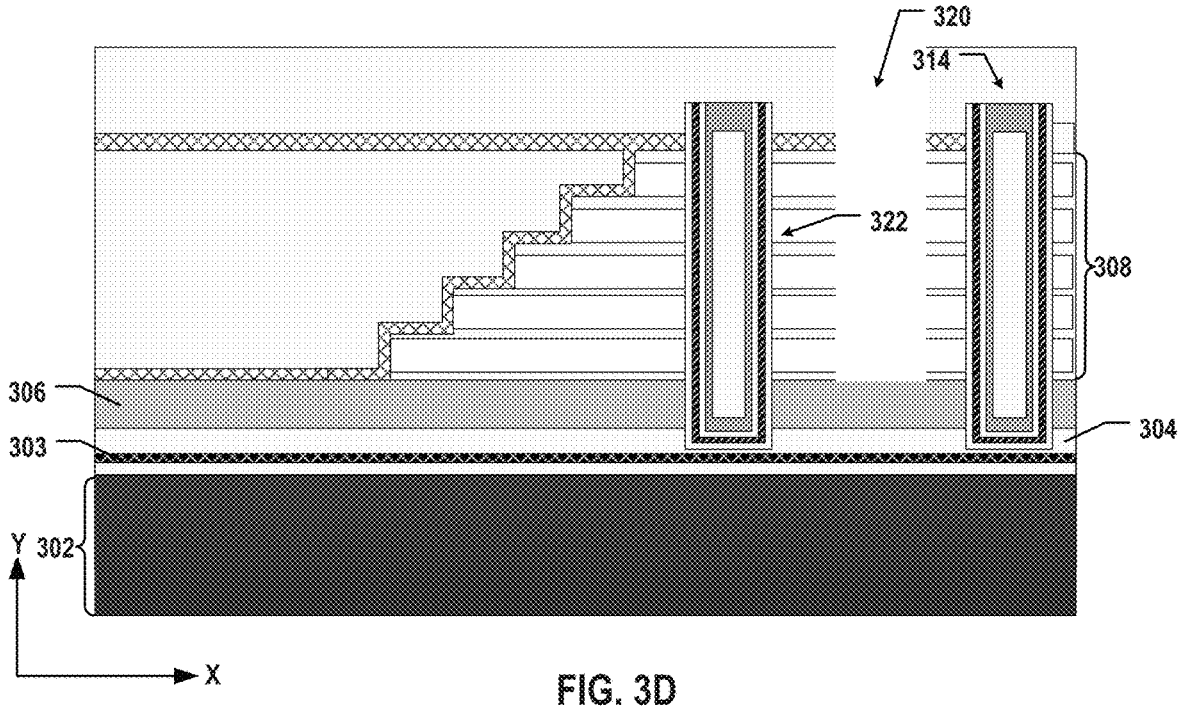

As shown in FIG. 1A, 3D memory device 100 can further include a BEOL interconnect layer 133 above and electrically connected to source contact 132 for pad-out, e.g., transferring electrical signals between 3D memory device 100 and external circuits. In some implementations, interconnect layer 133 includes one or more ILD layers 134 on doped semiconductor layer 122 and a redistribution layer 136 on ILD layers 134. The upper end of source contact 132 is flush with the top surface of ILD layers 134, and the bottom surface of redistribution layer 136, and source contact 132 extends vertically through ILD layers 134 to be in contact with doped semiconductor layer 122, according to some implementations. ILD layers 134 in interconnect layer 133 can include dielectric materials including, but not limited to, silicon oxide, silicon nitride, silicon oxynitride, low-k dielectrics, or any combination thereof. Redistribution layer 136 in interconnect layer 133 can include conductive materials including, but not limited to W, Co, Cu, Al, silicides, or any combination thereof. In some implementations, interconnect layer 133 further includes a passivation layer 138 as the outmost layer for passivation and protection of 3D memory device 100. Part of redistribution layer 136 can be exposed from passivation layer 138 as contact pads 140. That is, interconnect layer 133 of 3D memory device 100 can also include contact pads 140 for wire bonding and/or bonding with an interposer. As described below with respect to the fabrication process, in some implementations, source contacts 132 and redistribution layer 136 may be formed by the same process and have the same material, e.g., Al. Thus, source contacts 132 may be viewed as part of BEOL interconnect layer 133 as well in some examples.

In some implementations, second semiconductor structure 104 of 3D memory device 100 further includes contacts 142 and 144 through doped semiconductor layer 122 and filling layer 120. As doped semiconductor layer 122 can include polysilicon, contacts 142 and 144 are through silicon contacts (TSCs), according to some implementations. In some implementations, contact 142 extends through doped semiconductor layer 122, filling layer 120, and ILD layers 134 to be in contact with redistribution layer 136, such that doped semiconductor layer 122 is electrically connected to contact 142 through source contact 132 and redistribution layer 136 of interconnect layer 133. In some implementations, contact 144 extends through doped semiconductor layer 122, filling layer 120, and ILD layers 134 to be in contact with contact pad 140. Contacts 142 and 144 each can include one or more conductive layers, such as a metal layer (e.g., W, Co, Cu, or Al) or a silicide layer surrounded by an adhesive layer (e.g., TiN). In some implementations, at least contact 144 further includes a spacer (e.g., a dielectric layer) to electrically separate contact 144 from doped semiconductor layer 122 and filling layer 120.

In some implementations, 3D memory device 100 further includes peripheral contacts 146 and 148 each extending vertically outside of memory stack 114. Each peripheral contact 146 or 148 can have a depth greater than the depth of memory stack 114 to extend vertically from bonding layer 112 to filling layer 120 in a peripheral region that is outside of memory stack 114. In some implementations, peripheral contact 146 is below and in contact with contact 142, such that doped semiconductor layer 122 is electrically connected to peripheral circuit 108 in first semiconductor structure 102 through at least source contact 132, redistribution layer 136, contact 142, and peripheral contact 146. In some implementations, peripheral contact 148 is below and in contact with contact 144, such that peripheral circuit 108 in first semiconductor structure 102 is electrically connected to contact pad 140 for pad-out through at least contact 144 and peripheral contact 148. Peripheral contacts 146 and 148 each can include one or more conductive layers, such as a metal layer (e.g., W, Co, Cu, or Al) or a silicide layer surrounded by an adhesive layer (e.g., TiN).

As shown in FIG. 1A, 3D memory device 100 also includes a variety of local contacts (also known as "C1") as part of the interconnect structure, which are in contact with a structure in memory stack 114 directly. In some implementations, the local contacts include channel local contacts 150 each below and in contact with the lower end of respective channel structure 124. Each channel local contact 150 can be electrically connected to a bit line contact (not shown) for bit line fan-out. In some implementations, the local contacts further include word line local contacts 152 each below and in contact with respective stack conductive layer 116 (including a word line) at the staircase structure of memory stack 114 for word line fan-out. Local contacts, such as channel local contacts 150 and word line local contacts 152, can be electrically connected to peripheral circuits 108 of first semiconductor structure 102 through at least bonding layers 112 and 110. Local contacts, such as channel local contacts 150 and word line local contacts 152, each can include one or more conductive layers, such as a metal layer (e.g., W, Co, Cu, or Al) or a silicide layer surrounded by an adhesive layer (e.g., TiN).

Although an exemplary 3D memory device 100 is shown in FIG. 1A, it is understood that by varying the relative positions of first and second semiconductor structures 102 and 104, the usage of backside source contacts 132 or known front side source contacts (not shown), and/or the pad-out locations (e.g., through first semiconductor structure 102 and/or second semiconductor structure 104), any other suitable architectures of 3D memory devices may be applicable in the present disclosure without further detailed elaboration.

FIG. 1B illustrates a side view of a cross-section of another exemplary 3D memory device 160, according to some embodiments of the present disclosure. 3D memory device 160 is similar to 3D memory device 100 except for the different structures of doped semiconductor layer 122 and the upper ends of capping layer 127. It is understood that the details of other same structures in both 3D memory devices 160 and 100 are not repeated for case of description.

As shown in FIG. 1B, doped semiconductor layer 122 does not include any plug (e.g., plug 123 in FIG. 1A) extending into channel structure 124, according to some embodiments. That is, in some embodiments, the entire doped semiconductor layer 122 may be view as plate 121. Without plug 123 extending into channel structure 124, capping layer 127 of channel structure 124 can fully fill the channel hole and thus, extend beyond memory stack 114 in the first direction (e.g., the positive y-direction in FIG. 1B) and is in contact with doped semiconductor layer 122. That is, the upper ends of memory film 126, semiconductor channel 128, and capping layer 127 can be flush with one another and in contact with doped semiconductor layer 122. As a result, in some embodiments, channel structure 124 extends beyond memory stack 114 in the first direction (e.g., the positive y-direction in FIG. 1B) and is in contact with doped semiconductor layer 122.

Figure 7:
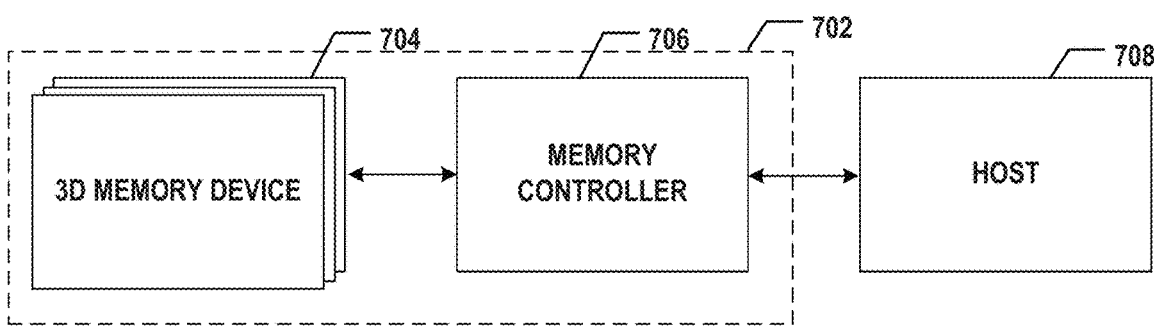
FIG. 7 illustrates a block diagram of an exemplary system having a 3D memory device, according to some aspects of the present disclosure.

FIG. 7 illustrates a block diagram of an exemplary system 700 having a 3D memory device, according to some aspects of the present disclosure. System 700 can be a mobile phone, a desktop computer, a laptop computer, a tablet, a vehicle computer, a gaming console, a printer, a positioning device, a wearable electronic device, a smart sensor, a virtual reality (VR) device, an argument reality (AR) device, or any other suitable electronic devices having storage therein. As shown in FIG. 7, system 700 can include a host 708 and a memory system 702 having one or more 3D memory devices 704 and a memory controller 706. Host 708 can be a processor of an electronic device, such as a central processing unit (CPU), or a system-on-chip (SoC), such as an application processor (AP). Host 708 can be configured to send or receive data to or from 3D memory devices 704.

3D memory device 704 can be any 3D memory devices disclosed herein, such as 3D memory devices 100 and 160 shown in FIGS. 1A and 1B. In some implementations, each 3D memory device 704 includes a NAND Flash memory. Consistent with the scope of the present disclosure, the semiconductor channel of 3D memory device 704 can be partially doped such that part of the semiconductor channel that forms the source contact is highly doped to lower the potential barrier while leaving another part of the semiconductor channel that forms the memory cells remaining undoped or lowly doped. One end of each channel structure of 3D memory device 704 can be opened from the backside to expose the doped part of the respective semiconductor channel. 3D memory device 704 can further include a doped semiconductor layer electrically connecting the exposed doped parts of the semiconductor channels to further reduce the contact resistance and sheet resistance. As a result, the electric performance of 3D memory device 704 can be improved, which in turn improves the performance of memory system 702 and system 700, e.g., achieving higher operation speed.

Memory controller 706 is coupled to 3D memory device 704 and host 708 and is configured to control 3D memory device 704, according to some implementations. Memory controller 706 can manage the data stored in 3D memory device 704 and communicate with host 708. In some implementations, memory controller 706 is designed for operating in a low duty-cycle environment like secure digital (SD) cards, compact Flash (CF) cards, universal serial bus (USB) Flash drives, or other media for use in electronic devices, such as personal computers, digital cameras, mobile phones, etc. In some implementations, memory controller 706 is designed for operating in a high duty-cycle environment SSDs or embedded multi-media-cards (eMMCs) used as data storage for mobile devices, such as smartphones, tablets, laptop computers, etc., and enterprise storage arrays. Memory controller 706 can be configured to control operations of 3D memory device 704, such as read, erase, and program operations. Memory controller 706 can also be configured to manage various functions with respect to the data stored or to be stored in 3D memory device 704 including, but not limited to bad-block management, garbage collection, logical-to-physical address conversion, wear leveling, etc. In some implementations, memory controller 706 is further configured to process error correction codes (ECCs) with respect to the data read from or written to 3D memory device 704. Any other suitable functions may be performed by memory controller 706 as well, for example, formatting 3D memory device 704. Memory controller 706 can communicate with an external device (e.g., host 708) according to a particular communication protocol. For example, memory controller 706 may communicate with the external device through at least one of various interface protocols, such as a USB protocol, an MMC protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, an integrated drive electronics (IDE) protocol, a Firewire protocol, etc.

Figure 8A:
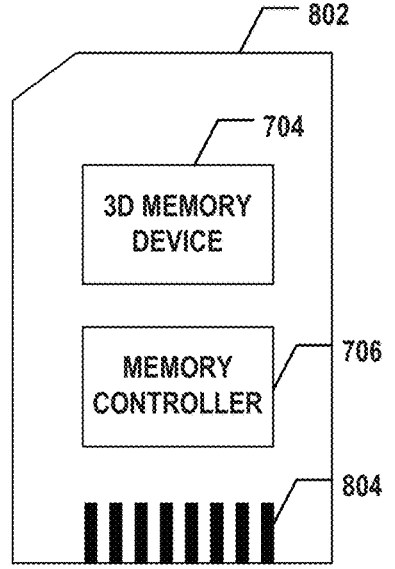
FIG. 8A illustrates a diagram of an exemplary memory card having a 3D memory device, according to some aspects of the present disclosure.
Figure 8B:
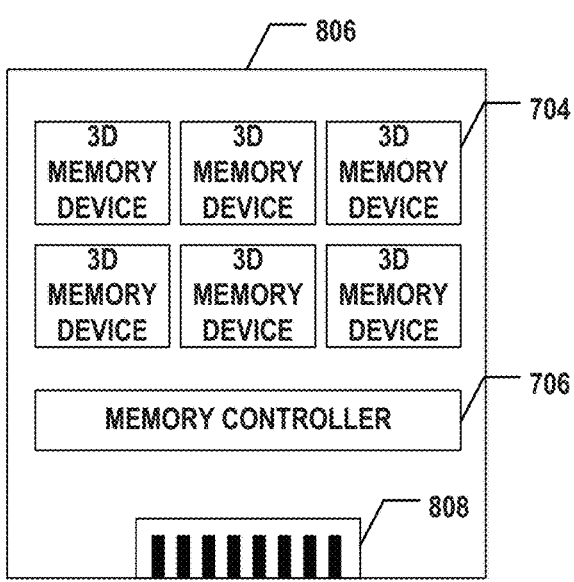
FIG. 8B illustrates a diagram of an exemplary solid-state drive (SSD) having a 3D memory device, according to some aspects of the present disclosure.

Memory controller 706 and one or more 3D memory devices 704 can be integrated into various types of storage devices, for example, be included in the same package, such as a universal Flash storage (UFS) package or an eMMC package. That is, memory system 702 can be implemented and packaged into different types of end electronic products. In one example as shown in FIG. 8A, memory controller 706 and a single 3D memory device 704 may be integrated into a memory card 802. Memory card 802 can include a PC card (PCMCIA, personal computer memory card international association), a CF card, a smart media (SM) card, a memory stick, a multimedia card (MMC, RS-MMC, MMCmicro), an SD card (SD, miniSD, microSD, SDHC), a UFS, etc. Memory card 802 can further include a memory card connector 804 electrically coupling memory card 802 with a host (e.g., host 708 in FIG. 7). In another example as shown in FIG. 8B, memory controller 706 and multiple 3D memory devices 704 may be integrated into an SSD 806. SSD 806 can further include an SSD connector 808 electrically coupling SSD 806 with a host (e.g., host 708 in FIG. 7). In some implementations, the storage capacity and/or the operation speed of SSD 806 is greater than those of memory card 802.

FIGS. 3A-3O illustrate a fabrication process for forming an exemplary 3D memory device, according to some implementations of the present disclosure. FIG. 5 illustrates a flowchart of a method 500 for forming an exemplary 3D memory device, according to some implementations of the present disclosure. Examples of the 3D memory device depicted in FIGS. 3A-3O and 5 include 3D memory device 100 depicted in FIG. 1A. FIGS. 3A-3O and 5 will be described together. It is understood that the operations shown in method 500 are not exhaustive and that other operations can be performed as well before, after, or between any of the illustrated operations. Further, some of the operations may be performed simultaneously, or in a different order than shown in FIG. 5.

Referring to FIG. 5, method 500 starts at operation 502, in which a peripheral circuit is formed on a first substrate. The first substrate can be a silicon substrate. As illustrated in FIG. 3G, a plurality of transistors are formed on a silicon substrate 350 using a plurality of processes including, but not limited to, photolithography, etching, thin film deposition, thermal growth, implantation, chemical mechanical polishing (CMP), and any other suitable processes. In some implementations, doped regions (not shown) are formed in silicon substrate 350 by ion implantation and/or thermal diffusion, which function, for example, as source regions and/or drain regions of the transistors. In some implementations, isolation regions (e.g., STIs) are also formed in silicon substrate 350 by wet etching and/or dry etching and thin film deposition. The transistors can form peripheral circuits 352 on silicon substrate 350.

As illustrated in FIG. 3G, a bonding layer 348 is formed above peripheral circuits 352. Bonding layer 348 includes bonding contacts electrically connected to peripheral circuits 352. To form bonding layer 348, an ILD layer is deposited using one or more thin film deposition processes, such as chemical vapor deposition (CVD), physical vapor deposition (PVD), atomic layer deposition (ALD), or any combination thereof; the bonding contacts through the ILD layer are formed using wet etching and/or dry etching, e.g., reactive ion etching (RIE), followed by one or more thin film deposition processes, such as ALD, CVD, PVD, any other suitable processes, or any combination thereof.

Method 500 proceeds to operation 504, as illustrated in FIG. 5, in which a filling layer is formed above a second substrate, and a stack structure is formed above the filling layer. The filling layer and stack structure can be formed on the front side of the second substrate on which semiconductor devices can be formed. The second substrate can be a silicon substrate. It is understood that since the second substrate will be removed from the final product, the second substrate may be part of a dummy wafer, for example, a carrier substrate, made of any suitable materials, such as glass, sapphire, plastic, silicon, to name a few, to reduce the cost of the second substrate. In some implementations, the substrate is a carrier substrate. In some implementations, the filling layer includes polysilicon, a high-k dielectric, or a metal, and the stack structure includes a dielectric stack having interleaved stack dielectric layers and stack sacrificial layers. It is understood that in some examples, the stack structure may include a memory stack having interleaved stack dielectric layers (e.g., silicon oxide layers) and stack conductive layers (e.g., polysilicon layers).

To better control the gauging and surface flatness of various structures to be formed on the second substrate, a variety of stop layers can be formed between the second substrate and the filling layer. In some implementations, a first stop layer and a second stop layer are sequentially formed between the second substrate and the filling layer. The first stop layer can include silicon oxide or silicon nitride, and the second stop layer can include silicon oxide or polysilicon. In some implementations, a third stop layer, such as a silicon nitride layer or a polysilicon layer, is formed between the second stop layer and the filling layer. In some implementations, a single stop layer, such as a silicon oxide layer or a high-k dielectric layer, is formed between the second substrate and the filling layer.

As illustrated in FIG. 3A, a first stop layer 303 is formed above a carrier substrate 302, a second stop layer 304 is formed on first stop layer 303, and a filling layer 306 is formed on second stop layer 304. Filling layer 306 can include polysilicon, a high-k dielectric, or a metal. Second stop layer 304 can act as an etch stop layer when etching the channel holes from the front side and thus, may include any suitable materials that have a high etching selectivity (e.g., greater than about 5) with respect to the material directly on second stop layer 304), such as silicon oxide or polysilicon. First stop layer 303 can act as a CMP/etch stop layer when removing carrier substrate 302 from the backside and thus, may include any suitable materials other than the material of carrier substrate 302, such as silicon nitride or silicon oxide. It is understood that in some examples, pad oxide layers (e.g., silicon oxide layers) may be formed between carrier substrate 302 and first stop layer 303 to relax the stress between different layers and avoid peeling.

As shown in FIG. 3A, a stack of silicon oxide layer (pad oxide layer), silicon nitride layer (first stop layer 303), and silicon oxide layer (second stop layer 304) can be sequentially formed on carrier substrate 302 using one or more thin film deposition processes including, but not limited to, CVD, PVD, ALD, or any combination thereof. In some implementations, filling layer 306 is formed by depositing polysilicon, or any other suitable materials, such as a high-k dielectric or a metal, on second stop layer 304 using one or more thin film deposition processes including, but not limited to, CVD, PVD, ALD, or any combination thereof. For ease of description, the combination of the stop layers shown in FIG. 3A is used through the present disclosure to describe the fabrication process. It is understood that, however, any other suitable combinations of stop layer(s) may be used in other examples as well. In an example not shown, a single oxide layer or a high-k dielectric layer (as first and second stop layers 303 and 304) may be formed on carrier substrate 302 using one or more thin film deposition processes including, but not limited to, CVD, PVD, ALD, or any combination thereof.

As illustrated in FIG. 3B, a dielectric stack 308 including a plurality pairs of a first dielectric layer (referred to herein as "stack sacrificial layer" 312) and a second dielectric layer (referred to herein as "stack dielectric layers" 310, together referred to herein as "dielectric layer pairs") is formed on filling layer 306. Dielectric stack 308 includes interleaved stack sacrificial layers 312 and stack dielectric layers 310, according to some implementations. Stack dielectric layers 310 and stack sacrificial layers 312 can be alternatingly deposited on filling layer 306 above carrier substrate 302 to form dielectric stack 308. In some implementations, each stack dielectric layer 310 includes a layer of silicon oxide, and each stack sacrificial layer 312 includes a layer of silicon nitride. Dielectric stack 308 can be formed by one or more thin film deposition processes including, but not limited to, CVD, PVD, ALD, or any combination thereof. As illustrated in FIG. 3B, a staircase structure can be formed on the edge of dielectric stack 308. The staircase structure can be formed by performing a plurality of so-called "trim-etch" cycles to the dielectric layer pairs of dielectric stack 308 toward carrier substrate 302. Due to the repeated trim-etch cycles applied to the dielectric layer pairs of dielectric stack 308, dielectric stack 308 can have one or more tilted edges and a top dielectric layer pair shorter than the bottom one, as shown in FIG. 3B.

Method 500 proceeds to operation 506, as illustrated in FIG. 5, in which a channel structure extending vertically through the dielectric stack and the filling layer is formed. The channel structure can include a memory film and a semiconductor channel. In some implementations, to form the channel structure, a channel hole extending vertically through the dielectric stack and the filling layer is formed, stopping at the second stop layer, and the memory film, the semiconductor channel, and a capping layer are sequentially formed in the channel hole.

As illustrated in FIG. 3B, each channel hole is an opening extending vertically through dielectric stack 308 and filling layer 306, stopping at second stop layer 304. In some implementations, a plurality of openings are formed, such that each opening becomes the location for growing an individual channel structure 314 in the later process. In some implementations, fabrication processes for forming the channel holes of channel structures 314 include wet etching and/or dry etching, such as deep RIE (DRIE). The etching of the channel holes continues until being stopped by second stop layer 304, such as silicon oxide or polysilicon, according to some implementations. In some implementations, the etching conditions, such as etching rate and time, can be controlled to ensure that each channel hole has reached and stopped by second stop layer 304 to minimize the gouging variations among the channel holes and channel structures 314 formed therein. It is understood that depending on the specific etching selectivity, one or more channel holes may extend into second stop layer 304 to a small extent, which is still viewed as being stopped by second stop layer 304 in the present disclosure.

As illustrated in FIG. 3B, a memory film including a blocking layer 317, a storage layer 316, and a tunneling layer 315, and a semiconductor channel 318 are sequentially formed in this order along sidewalls and the bottom surface of the channel hole. In some implementations, blocking layer 317, storage layer 316, and tunneling layer 315 are first deposited along the sidewalls and bottom surface of the channel hole in this order using one or more thin film deposition processes, such as ALD, CVD, PVD, any other suitable processes, or any combination thereof, to form the memory film. Semiconductor channel 318 then can be formed by depositing a semiconductor material, such as polysilicon (e.g., undoped polysilicon), over tunneling layer 315 using one or more thin film deposition processes, such as ALD, CVD, PVD, any other suitable processes, or any combination thereof. In some implementations, a first silicon oxide layer, a silicon nitride layer, a second silicon oxide layer, and a polysilicon layer (a "SONO" structure) are sequentially deposited to form blocking layer 317, storage layer 316, and tunneling layer 315 of the memory film and semiconductor channel 318.

As illustrated in FIG. 3B, a capping layer 319 is formed in the channel hole and over semiconductor channel 318 to fully or partially fill the channel hole (e.g., without or with an air gap). Capping layer 319 can be formed by depositing a dielectric material, such as silicon oxide, using one or more thin film deposition processes, such as ALD, CVD, PVD, any other suitable processes, or any combination thereof. A channel plug can then be formed in the top portion of the channel hole. In some implementations, parts of the memory film, semiconductor channel 318, and capping layer 319 that are on the top surface of dielectric stack 308 are removed and planarized by CMP, wet etching, and/or dry etching. A recess then can be formed in the top portion of the channel hole by wet etching and/or drying etching parts of semiconductor channel 318 and capping layer 319 in the top portion of the channel hole. The channel plug can then be formed by depositing semiconductor materials, such as polysilicon, into the recess by one or more thin film deposition processes, such as CVD, PVD, ALD, or any combination thereof. Channel structure 314 is thereby formed through dielectric stack 308 and filling layer 306, stopping at second stop layer 304, according to some implementations.

As illustrated in FIG. 3C, a slit 320 is an opening that extends vertically through dielectric stack 308 and stops at filling layer 306. In some implementations, fabrication processes for forming slit 320 include wet etching and/or dry etching, such as DRIE. A gate replacement then can be performed through slit 320 to replace dielectric stack 308 with a memory stack 330 (shown in FIG. 3E).

As illustrated in FIG. 3D, lateral recesses 322 are first formed by removing stack sacrificial layers 312 (shown in FIG. 3C) through slit 320. In some implementations, stack sacrificial layers 312 are removed by applying etchants through slit 320, creating lateral recesses 322 interleaved between stack dielectric layers 310. The etchants can include any suitable etchants that etch stack sacrificial layers 312 selective to stack dielectric layers 310.

Figure 3E:
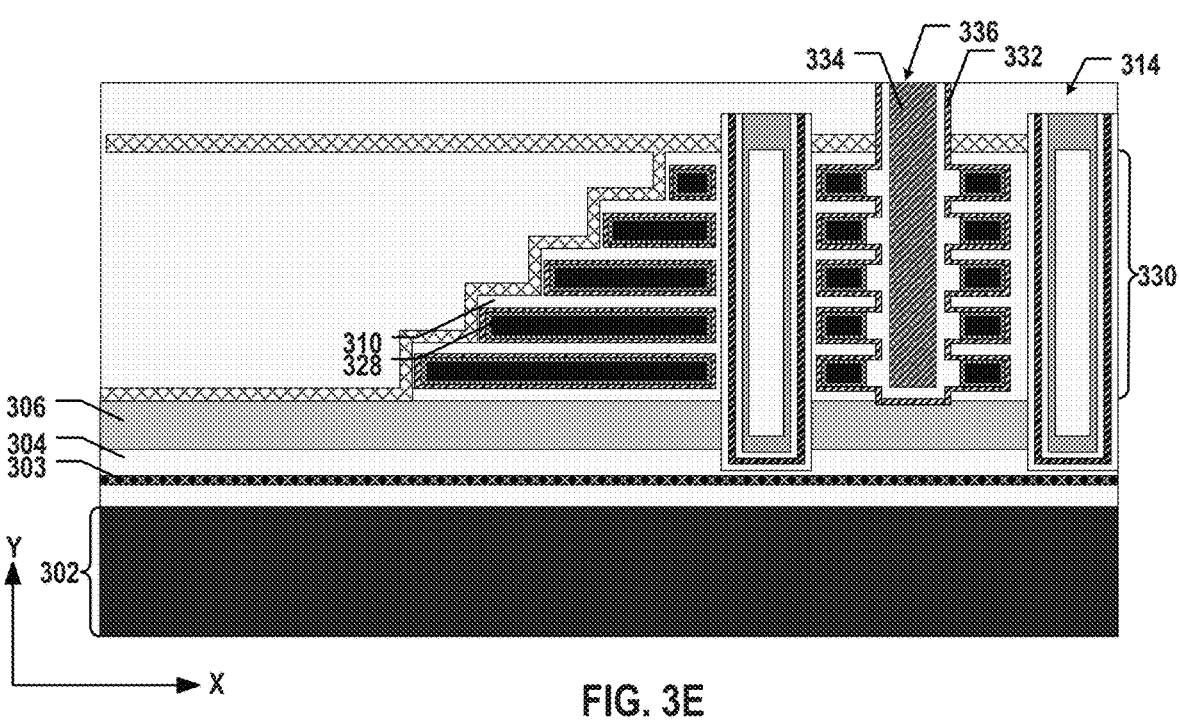

As illustrated in FIG. 3E, stack conductive layers 328 (including gate electrodes and adhesive layers) are deposited into lateral recesses 322 (shown in FIG. 3D) through slit 320. In some implementations, a gate dielectric layer 332 is deposited into lateral recesses 322 prior to stack conductive layers 328, such that stack conductive layers 328 are deposited on gate dielectric layer 332. Stack conductive layers 328, such as metal layers, can be deposited using one or more thin film deposition processes, such as ALD, CVD, PVD, any other suitable processes, or any combination thereof. In some implementations, gate dielectric layer 332, such as a high-k dielectric layer, is formed along the sidewall and at the bottom of slit 320 as well. Memory stack 330 including interleaved stack conductive layers 328 and stack dielectric layers 310 is thereby formed, replacing dielectric stack 308 (shown in FIG. 3D), according to some implementations.

As illustrated in FIG. 3E, an insulating structure 336 extending vertically through memory stack 330 is formed, stopping on the top surface of filling layer 306. Insulating structure 336 can be formed by depositing one or more dielectric materials, such as silicon oxide, into slit 320 to fully or partially fill slit 320 (with or without an air gap) using one or more thin film deposition processes, such as ALD, CVD, PVD, any other suitable processes, or any combination thereof. In some implementations, insulating structure 336 includes gate dielectric layer 332 (e.g., including high-k dielectrics) and a dielectric capping layer 334 (e.g., including silicon oxide). In some embodiments, dielectric capping layer 334 may partially fill the slit 320, and a polysilicon core layer 335 may fill the remaining space of slit 320 as part of insulating structure 336 to adjust the mechanical properties, such as hardness or stress, of insulating structure 336.

Figure 3F:
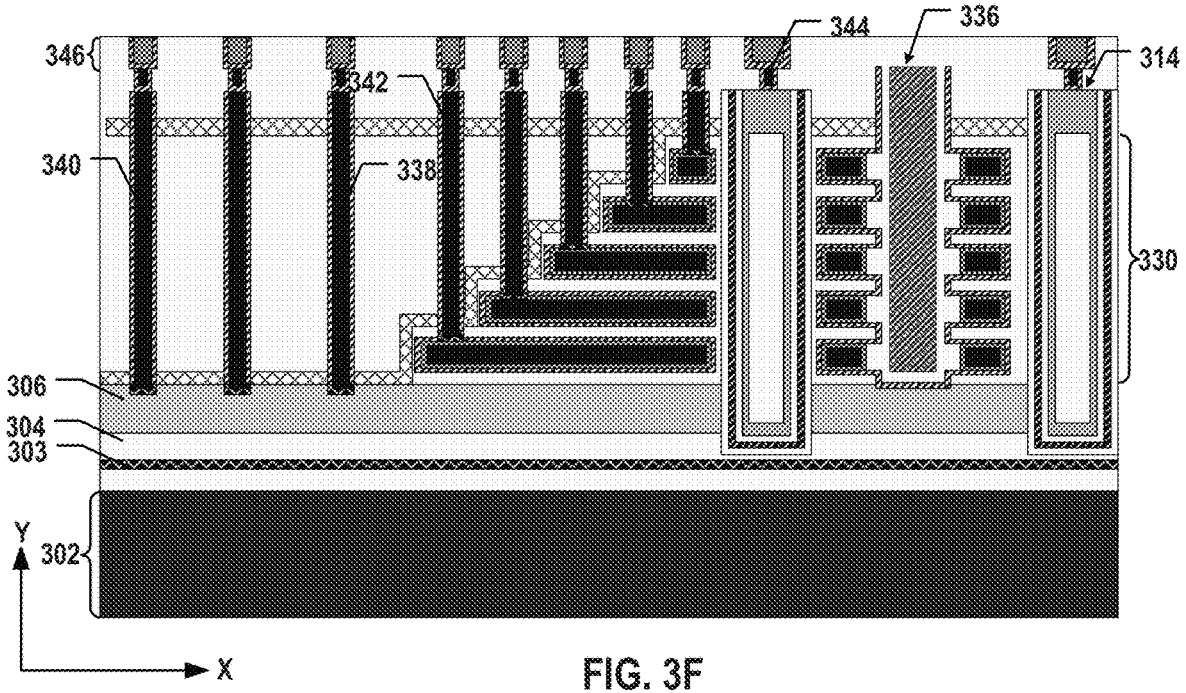

As illustrated in FIG. 3F, after the formation of insulating structure 336, local contacts, including channel local contacts 344 and word line local contacts 342, and peripheral contacts 338 and 340 are formed. A local dielectric layer can be formed on memory stack 330 by depositing dielectric materials, such as silicon oxide or silicon nitride, using one or more thin film deposition processes, such as CVD, PVD, ALD, or any combination thereof, on top of memory stack 330. Channel local contacts 344, word line local contacts 342, and peripheral contacts 338 and 340 can be formed by etching contact openings through the local dielectric layer (and any other ILD layers) using wet etching and/or dry etching, e.g., RIE, followed by filling the contact openings with conductive materials using one or more thin film deposition processes, such as ALD, CVD, PVD, any other suitable processes, or any combination thereof.

As illustrated in FIG. 3F, a bonding layer 346 is formed above channel local contacts 344, word line local contacts 342, and peripheral contacts 338 and 340. Bonding layer 346 includes bonding contacts electrically connected to channel local contacts 344, word line local contacts 342, and peripheral contacts 338 and 340. To form bonding layer 346, an ILD layer is deposited using one or more thin film deposition processes, such as CVD, PVD, ALD, or any combination thereof, and the bonding contacts are formed through the ILD layer using wet etching and/or dry etching, e.g., RIE, followed by one or more thin film deposition processes, such as ALD, CVD, PVD, any other suitable processes, or any combination thereof.

Method 500 proceeds to operation 508, as illustrated in FIG. 5, in which the first substrate and the second substrate are bonded in a face-to-face manner, such that the memory stack is above the peripheral circuit. The bonding can include hybrid bonding. As illustrated in FIG. 3G, carrier substrate 302 and components formed thereon (e.g., memory stack 330 and channel structures 314 formed therethrough) are flipped upside down. Bonding layer 346 facing down is bonded with bonding layer 348 facing up, i.e., in a face-to-face manner, thereby forming a bonding interface 354 between carrier substrate 302 and silicon substrate 350, according to some implementations. In some implementations, a treatment process, e.g., a plasma treatment, a wet treatment, and/or a thermal treatment, is applied to the bonding surfaces prior to the bonding. After the bonding, the bonding contacts in bonding layer 346 and the bonding contacts in bonding layer 348 are aligned and in contact with one another, such that memory stack 330 and channel structures 314 formed therethrough can be electrically connected to peripheral circuits 352 and are above peripheral circuits 352.

Figure 6:
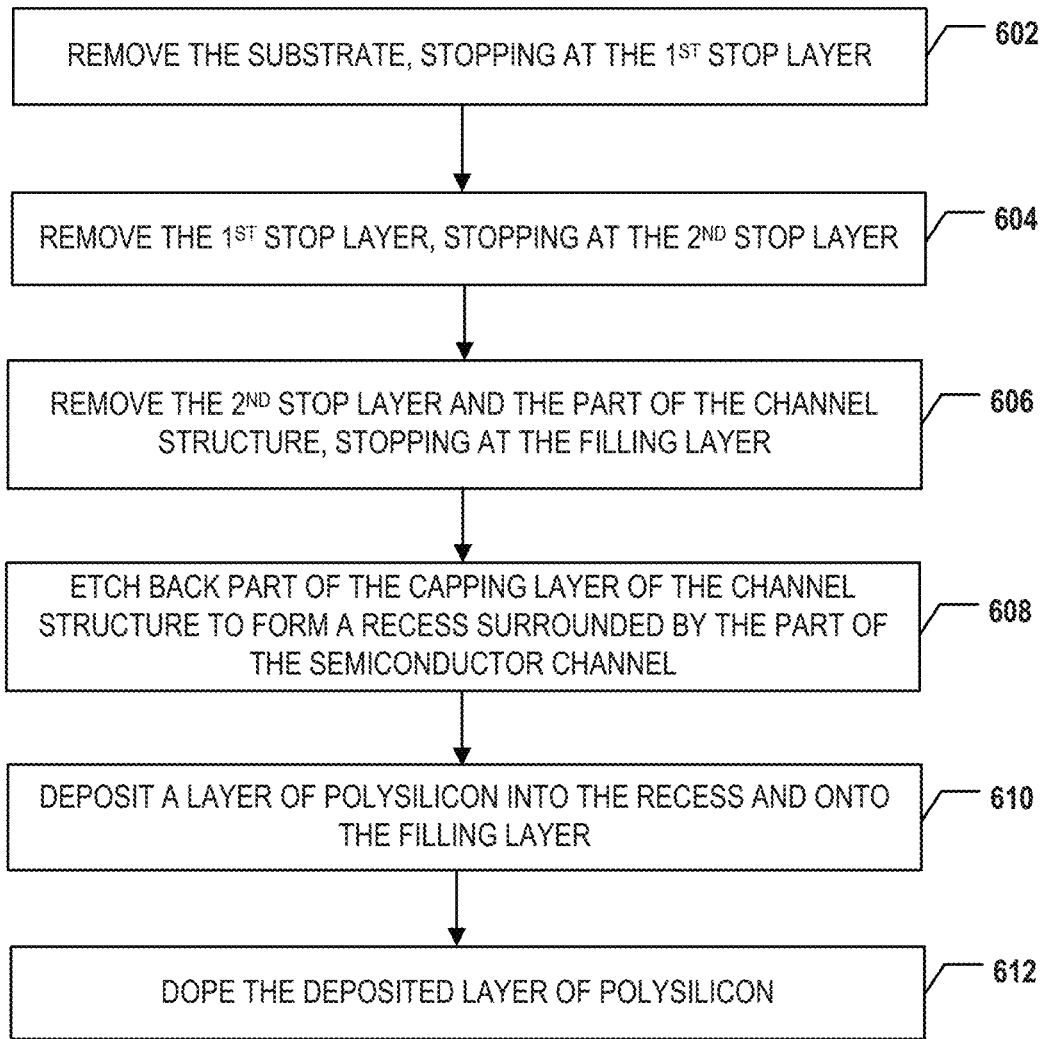
FIG. 6 illustrates a flowchart of another exemplary method for forming a 3D memory device, according to some aspects of the present disclosure.

Method 500 proceeds to operation 510, as illustrated in FIG. 5, in which the second substrate and part of the channel structure extending beyond the filling layer are sequentially removed to expose part of the semiconductor channel. The removal can be performed from the backside of the second substrate. As shown in FIG. 6, in some implementations, to sequentially remove the second substrate and the part of the channel structure, at 602, the second substrate is removed, stopping at the first stop layer; at 604, the first stop layer is removed, stopping at the second stop layer; at 606, the second stop layer and the part of the channel structure are removed, stopping at the filling layer. In some implementations, the removed part of the channel structure extends into the second stop layer, and the second stop layer and the part of the channel structure extending into the second stop layer are polished. As shown in FIG. 6, in some embodiments, at 608, part of the capping layer of the channel structure is etched back to form a recess surrounded by the part of the semiconductor channel.

Figure 3H:
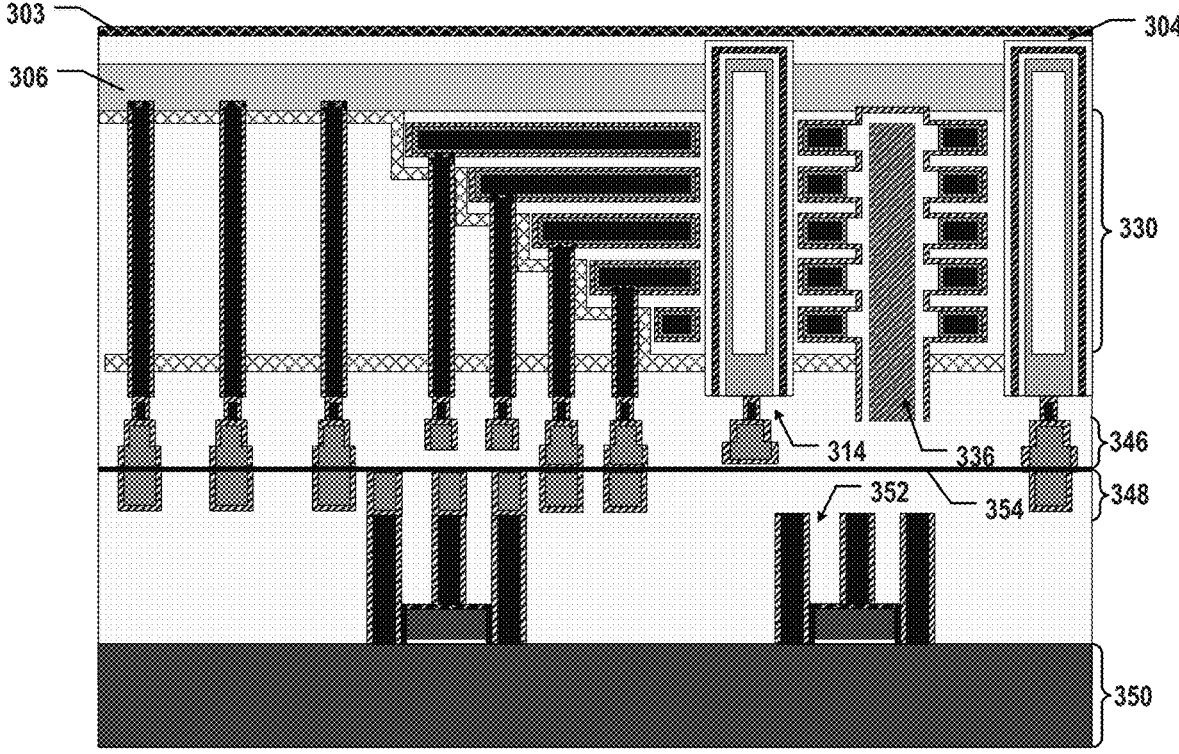

As illustrated in FIG. 3H, carrier substrate 302 (and a pad oxide layer between carrier substrate 302 and first stop layer 303, shown in FIG. 3G) are completely removed from the backside until being stopped by first stop layer 303 (e.g., a silicon nitride layer). Carrier substrate 302 can be completely removed using CMP, grinding, dry etching, and/or wet etching. In some implementations, carrier substrate 302 is peeled off. In some implementations in which carrier substrate 302 includes silicon and first stop layer 303 includes silicon nitride, carrier substrate 302 is removed using silicon CMP, which can be automatically stopped when reaching first stop layer 303 having materials other than silicon, i.e., acting as a backside CMP stop layer. In some implementations, carrier substrate 302 (a silicon substrate) is removed using wet etching by tetramethylammonium hydroxide (TMAH), which is automatically stopped when reaching first stop layer 303 having materials other than silicon, i.e., acting as a backside etch stop layer. First stop layer 303 can ensure the complete removal of carrier substrate 302 without the concern of thickness uniformity after thinning.

As shown in FIG. 3I, first and second stop layers 303 and 304 (shown in FIG. 3H) then can be completely removed as well using wet etching with suitable etchants, such as phosphoric acid and hydrofluoric acid, until being stopped by filling layer 306 having a different material (e.g., polysilicon) from second stop layer 304. As shown in FIG. 3I, part of channel structure 314 extending beyond filling layer 306 is removed, such that the upper end of channel structure 314 becomes flush with the top surface of filling layer 306. In some embodiments in which part of channel structure 314 extends into second stop layer 304, second stop layer 304 and the part of channel structure 314 extending into second stop layer 304 are removed together by polishing, such as CMP, stopping at filling layer 306. It is understood that in case that channel structure 314 does not extend beyond filling layer 306 and into second stop layer 304, the removal of the upper end of channel structure 314 may be skipped.

As illustrated in FIG. 3J, part of capping layer 319 is removed to form a recess 321 surrounded by the top portion of semiconductor channel 318. For example, part of capping layer 319 of channel structure 314 may be etched back to form recess 321, for example, using dry etching and/or wet etching. In some examples in case the upper end of capping layer 319 is still covered by semiconductor channel 318, part of semiconductor channel 318 may be etched first to expose capping layer 319. The etching of capping layer 319 can be controlled by controlling the etching time and/or etching rate, such that the etching does not continue beyond the source select gate line(s) (e.g., one or more stack conductive layers 328 closest to filling layer 306). The formation of recess 321 can expose part of semiconductor channel 318 surrounding recess 321. In some implementations, the top portion of semiconductor channel 318 exposed by recess 321 is doped to increase its conductivity. For example, a tilted ion implantation process may be performed to dope the top portion of semiconductor channel 318 (e.g., including polysilicon) exposed by recess 321 with any suitable dopants (e.g., N-type dopants such as P, As, or Sb) to a desired doping concentration.

The removal of parts of channel structure 314 from the backside is much less challenging and has a higher production yield compared with the known solutions using front side wet etching via the openings (e.g., slit 320 in FIG. 3D) through dielectric stack 308/memory stack 330 with a high aspect ratio (e.g., greater than 50). By avoiding the issues introduced by the high aspect ratio of slit 320, the fabrication complexity and cost can be reduced, and the yield can be increased. Also, the vertical scalability (e.g., the increasing level of dielectric stack 308/memory stack 330) can be improved as well.

Method 500 proceeds to operation 512, as illustrated in FIG. 5, in which a doped semiconductor layer in contact with the exposed part of the semiconductor channel is formed. In some implementations, the dopants include an N-type dopant. As shown in FIG. 6, in some implementations, to form the doped semiconductor layer, at 610, a layer of polysilicon is deposited into the recess and onto the filling layer; at 612, the deposited layer of polysilicon is doped.

As illustrated in FIG. 3K, a doped semiconductor layer 360 is formed in recess 321 (shown in FIG. 3J), surrounded by and in contact with (circumscribed by) the exposed part of semiconductor channel 318, as well as outside of recess 321 on filling layer 306. In some implementations, to form doped semiconductor layer 360, a semiconductor layer (e.g., polysilicon) is deposited in recess 321 in contact with the exposed part of semiconductor channel 318 and capping layer 319, as well as outside of recess 321 in contact with filling layer 306 using one or more thin film deposition processes, such as ALD, CVD, PVD, any other suitable processes, or any combination thereof. The deposited semiconductor layer can be doped with N-type dopant(s), such as P, As, or Sb, using ion implantation and/or thermal diffusion. In some implementations, to form doped semiconductor layer 360, in-situ doping of N-type dopants, such as P, As, or Sb, is performed when depositing the semiconductor layer into recess 321 and on filling layer 306. In some implementations, a CMP process can be performed to remove any excess doped semiconductor layer 360 as needed.

Method 500 proceeds to operation 514, as illustrated in FIG. 5, in which the doped semiconductor layer and the part of the semiconductor channel that is in contact with the doped semiconductor layer are locally activated. In some implementations, to locally activate, heat is applied in a confined area having the doped semiconductor layer and the part of the semiconductor channel to activate dopants in the doped semiconductor layer and the part of the semiconductor channel. The confined area can be between the stack structure and the doped semiconductor layer. In some implementations, the doping concentration of the doped semiconductor layer and the doping concentration of the part of the semiconductor channel in contact with the doped semiconductor layer each is between $10^{19}$ cm$^{-3}$ and $10^{21}$ cm$^{-3}$ after the activation.

As illustrated in FIG. 3L, doped semiconductor layer 360 and the part of semiconductor channel 318 in contact with doped semiconductor layer 360 are locally activated. In some implementations, heat is applied in a confined area having doped semiconductor layer 360 and the part of semiconductor channel 318 to activate the dopant(s) therein, such as N-type dopants (e.g., P, As, or Sb). For example, the confined area may be between memory stack 330 and doped semiconductor layer 360 in the vertical direction. The heat can be applied and focused by any suitable techniques, such as annealing, laser, ultrasound, or any other suitable thermal processes. In some implementations, the confined area that can be affected by the heat during the local activation process does not extend to and beyond bonding interface 354 to avoid heating bonding interface 354 and Cu interconnects used for connecting peripheral circuits 352. The local activation process can activate the dopants doped into doped semiconductor layer 360 (and the exposed part of semiconductor channel 318 in case it is already doped). As a result, the doping concentration of doped semiconductor layer 360 and the doping concentration of the exposed part of semiconductor channel 318 each is between $10^{19}$ cm$^{-3}$ and $10^{21}$ cm$^{-3}$ after the activation. In some implementations, the local activation process is controlled such that the dopants in doped semiconductor layer 360 (and in the exposed part of semiconductor channel 318 in case it is already doped) can diffuse from the source of channel structure 314 towards the drain of channel structure 314 until beyond the source select gate line(s) (e.g., one or more stack conductive layers 328 closest to filling layer 306), but not facing the word lines, as described above with respect to FIG. 2. In case the exposed part of semiconductor channel 318 has not been doped yet, doped semiconductor layer 360 can act as the doping source during the local activation process to diffuse the dopants from doped semiconductor layer 360 into semiconductor channel 318, such that the part of semiconductor channel 318 that is in contact with doped semiconductor layer 360 can become a doped portion, and doped semiconductor layer 360 and the doped portion of semiconductor channel 318 can have the same dopants and doping concentration.

The local activation process can activate the dopants such that the dopants can occupy the silicon lattices to reduce the contact resistance between doped semiconductor layer 360 and semiconductor channel 318 as well as to reduce the sheet resistance of doped semiconductor layer 360. On the other hand, by confining the heat during the local activation process into an area without heat-sensitive structures, any potential damages to the heat-sensitive structures, such as bonding interface 354 and Cu interconnects used for connecting peripheral circuits 352, can be reduced or avoided.

Method 500 proceeds to operation 516, as illustrated in FIG. 5, in which a source contact is formed in contact with the doped semiconductor layer. As illustrated in FIG. 3M, one or more ILD layers 356 are formed on doped semiconductor layer 360. ILD layers 356 can be formed by depositing dielectric materials on the top surface of doped semiconductor layer 360 using one or more thin film deposition processes, such as ALD, CVD, PVD, any other suitable processes, or any combination thereof. As illustrated in FIG. 3N, source contact openings 358 can be formed through ILD layers 356 to expose parts of doped semiconductor layer 360. In some implementations, source contact opening 358 is formed using wet etching and/or dry etching, such as RIE.

As illustrated in FIG. 3O, a source contact, as part of conductive layer 370, is formed in each source contact opening 358 (shown in FIG. 3N) at the backside of filling layer 306. The source contact is above and in contact with doped semiconductor layer 360, according to some implementations. In some implementations, conductive layer 370, such as Al, is deposited into source contact opening 358 using one or more thin film deposition processes, such as ALD, CVD, PVD, any other suitable processes, or any combination thereof, to fill source contact opening 358. A planarization process, such as CMP, can then be performed to remove excess conductive layer 370.

As illustrated in FIG. 3O, in some implementations, conductive layer 370 also includes a redistribution layer above and in contact with the source contacts. That is, conductive layer 370 is not only deposited into source contact openings 358 as the source contacts, but also deposited outside of source contact openings 358 onto ILD layers 356 as the redistribution layer that electrically connects multiple source contacts, according to some implementations.

As illustrated in FIG. 3O, in some implementations, conductive layer 370 further includes contacts extending through ILD layers 356, doped semiconductor layer 360, and filling layer 306. That is, conductive layer 370 is not only deposited into source contact openings 358 as the source contacts, but also deposited into contact openings 363 and 361 (shown in FIG. 3N) as the contacts that are electrically connected to peripheral contacts 338 and 340. As illustrated in FIGS. 3M and 3N, contact openings 363 and 361 each extending through a spacer layer 371, ILD layers 356, doped semiconductor layer 360, and filling layer 306 are formed using wet etching and/or dry etching, such as RIE. In some implementations, contact openings 363 and 361 are patterned using lithography to be aligned with peripheral contacts 338 and 340, respectively. The etching of contact openings 363 and 361 can stop at the upper ends of peripheral contacts 338 and 340 to expose peripheral contacts 338 and 340. As illustrated in FIG. 3N, a spacer 362 is formed from spacer layer 371 along the sidewalls of contact openings 363 and 361 to electrically separate doped semiconductor layer 360.

FIGS. 4A-4C illustrate a fabrication process for forming another exemplary 3D memory device, according to some embodiments of the present disclosure. Examples of the 3D memory device depicted in FIGS. 4A-4C include 3D memory device 160 depicted in FIG. 1B. Different from FIG. 3J in which recess 321 is formed by etching back capping layer 319, as shown in FIG. 4A, the top portion of semiconductor channel 318 is doped to increase its conductivity without first etching back capping layer 319 to expose part of semiconductor channel 318. For example, a tilted ion implantation process may be performed to dope the top portion of semiconductor channel 318 (e.g., including polysilicon) with any suitable dopants (e.g., N-type dopants such as P, As, or Sb) to a desired doping concentration.

In some embodiments, to form the doped semiconductor layer, a layer of polysilicon onto the filling layer, and the deposited layer of polysilicon is doped. As shown in FIG. 4B, doped semiconductor layer 360 is formed on filling layer 306 as well as on the upper end of channel structure 314. In some implementations, to form doped semiconductor layer 360, a semiconductor layer (e.g., polysilicon) is deposited on filling layer 306 using one or more thin film deposition processes, such as ALD, CVD, PVD, any other suitable processes, or any combination thereof. The deposited semiconductor layer can be doped with N-type dopant(s), such as P, As, or Sb, using ion implantation and/or thermal diffusion. In some implementations, to form doped semiconductor layer 360, in-situ doping of N-type dopants, such as P, As, or Sb, is performed when depositing the semiconductor layer on filling layer 306. In some implementations, a CMP process can be performed to remove any excess doped semiconductor layer 360 as needed.

As shown in FIG. 4C, doped semiconductor layer 360 and the doped portion of semiconductor channel 318 are locally activated. In some implementations, heat is applied in a confined area having doped semiconductor layer 360 and the doped portion of semiconductor channel 318 to activate the dopant(s) therein, such as N-type dopants (e.g., P, As, or Sb). The local activation process can activate the dopants doped into doped semiconductor layer 360 and the doped portion of semiconductor channel 318. As a result, the doping concentration of doped semiconductor layer 360 and the doping concentration of the doped portion of semiconductor channel 318 each is between $10^{19}$ cm$^{-3}$ and $10^{21}$ cm$^{-3}$ after the activation. In some implementations, the local activation process is controlled such that the dopants in doped semiconductor layer 360 and the doped portion of semiconductor channel 318 can diffuse from the source of channel structure 314 towards the drain of channel structure 314 until beyond the source select gate line(s) (e.g., one or more stack conductive layers 328 closest to filling layer 306), but not facing the word lines, as described above with respect to FIG. 2.

According to one aspect of the present disclosure, a 3D memory device includes a stack structure including interleaved conductive layers and dielectric layers, a channel structure extending through the stack structure, and a doped semiconductor layer including a plate and a plug extending from the plate into the channel structure. The channel structure includes a memory film and a semiconductor channel. The semiconductor channel includes a doped portion, and a part of the doped portion of the semiconductor channel extends beyond the stack structure in a first direction. The doped portion of the semiconductor channel circumscribes the plug of the doped semiconductor layer.

In some implementations, a doping concentration of the doped portion of the semiconductor channel and a doping concentration of the doped semiconductor layer each is between $10^{19}$ cm$^{-3}$ and $10^{21}$ cm$^{-3}$.

In some implementations, the doped portion of the semiconductor channel and the doped semiconductor layer each includes N-type doped polysilicon.

In some implementations, the doped portion of the semiconductor channel and the plug of the doped semiconductor layer each extends beyond one of the conductive layers in a second direction opposite to the first direction.

In some implementations, the one of the conductive layers includes a source select gate line.

In some implementations, the 3D memory device further includes a filling layer between the stack structure and the plate of the doped semiconductor layer.

In some implementations, the filling layer includes polysilicon, a high-k dielectric, or a metal.

In some implementations, the 3D memory device further includes a source contact in contact with the doped semiconductor layer.

In some implementations, the memory film extends beyond the stack structure in the first direction and is in contact with the plate of the doped semiconductor layer.

In some implementations, the plug of the doped semiconductor layer is configured to generate GIDL-assisted body bias when performing an erase operation.

According to another aspect of the present disclosure, a 3D memory device includes a stack structure including interleaved conductive layers and stack dielectric layers, a doped semiconductor layer, and a channel structure extending through the stack structure. The channel structure includes a memory film and a semiconductor channel. The channel structure includes a memory film and a semiconductor channel. The semiconductor channel includes a doped portion. The channel structure extends beyond the stack structure in a first direction and is in contact with the doped semiconductor layer. The semiconductor channel includes a doped portion extending beyond one of the conductive layers in a second direction opposite to the first direction.

In some implementations, a doping concentration of the doped portion of the semiconductor channel and a doping concentration of the doped semiconductor layer each is between $10^{19}$ cm$^{-3}$ and $10^{21}$ cm$^{-3}$.

In some implementations, the doped portion of the semiconductor channel and the doped semiconductor layer each includes N-type doped polysilicon.

In some implementations, the one of the conductive layers comprises a source select gate line.

In some implementations, a part of the doped portion of the semiconductor channel extends beyond the stack structure in the first direction and is in contact with the doped semiconductor layer.

In some implementations, the 3D memory device further includes a filling layer between the stack structure and the doped semiconductor layer.

In some implementations, the filling layer includes polysilicon, a high-k dielectric, or a metal.

In some implementations, the 3D memory device further includes a source contact in contact with the doped semiconductor layer.

In some implementations, the channel structure further includes a capping layer extending beyond the stack structure in the first direction and is in contact with the doped semiconductor layer.

In some implementations, the doped semiconductor layer is configured to generate GIDL-assisted body bias when performing an erase operation.

According to still another aspect of the present disclosure, a method for forming a 3D memory device is provided. A filling layer is formed above a substrate. A stack structure is formed above the filling layer. A channel structure extending through the stack structure and the filling layer is formed. The channel structure includes a memory film and a semiconductor channel. The substrate and part of the channel structure extending beyond the filling layer are sequentially removed to expose part of the semiconductor channel. A doped semiconductor layer is formed in contact with the exposed part of the semiconductor channel. The doped semiconductor layer and the part of the semiconductor channel that is in contact with the doped semiconductor layer are locally activated.

In some implementations, to locally activate, heat is applied in a confined area having the doped semiconductor layer and the part of the semiconductor channel to activate dopants in the doped semiconductor layer and the part of the semiconductor channel.

In some implementations, the confined area is between the stack structure and the doped semiconductor layer.

In some implementations, the dopants include an N-type dopant, and after the activation, a doping concentration of the doped semiconductor layer and a doping concentration of the part of the semiconductor channel in contact with the doped semiconductor layer each is between $10^{19}$ cm$^{-3}$ and $10^{21}$ cm$^{-3}$.

In some implementations, prior to forming the doped semiconductor layer, the exposed part of the semiconductor channel is doped.

In some implementations, a first stop layer and a second stop layer are sequentially formed between the substrate and the filling layer.

In some implementations, the first stop layer includes silicon oxide or silicon nitride, the second stop layer includes silicon oxide or polysilicon, and the filling layer includes polysilicon, a high-k dielectric, or a metal.

In some implementations, to form the channel structure, a channel hole is formed extending through the stack structure and the filling layer, stopping at the second stop layer, and the memory film, the semiconductor channel, and a capping layer are sequentially formed in the channel hole.

In some implementations, to sequentially remove the substrate and the part of the memory film, the substrate is removed, stopping at the first stop layer, the first stop layer is removed, stopping at the second stop layer, and the second stop layer and the part of the channel structure are removed, stopping at the filling layer.

In some implementations, the removed part of the channel structure extends into the second stop layer. In some implementations, to remove the second stop layer and the part of the channel structure, the second stop layer and the part of the channel structure extending into the second stop layer are polished.

In some implementations, to sequentially remove the substrate and the part of the channel structure, a part of the capping layer of the channel structure is etched back to form a recess surrounded by the part of the semiconductor channel.

In some implementations, to form the doped semiconductor layer, a layer of polysilicon is deposited into the recess and onto the filling layer, and the deposited layer of polysilicon is doped.

In some implementations, to form the doped semiconductor layer, a layer of polysilicon is deposited onto the filling layer, and the deposited layer of polysilicon is doped.

In some implementations, after locally activating the doped semiconductor layer, a source contact is formed in contact with the doped semiconductor layer.

According to yet another aspect of the present disclosure, a system includes a 3D memory device configured to store data and a memory controller coupled to the 3D memory device and configured to control the 3D memory device. The 3D memory device includes a stack structure including interleaved conductive layers and dielectric layers, a channel structure extending through the stack structure, and a doped semiconductor layer including a plate and a plug extending from the plate into the channel structure. The channel structure includes a memory film and a semiconductor channel. The semiconductor channel includes a doped portion, and a part of the doped portion of the semiconductor channel extends beyond the stack structure in a first direction. The doped portion of the semiconductor channel circumscribes the plug of the doped semiconductor layer.

In some implementations, the system further includes a host coupled to the memory controller and configured to send or receive the data.

The foregoing description of the specific implementations can be readily modified and/or adapted for various applications. Therefore, such adaptations and modifications are intended to be within the meaning and range of equivalents of the disclosed implementations, based on the teaching and guidance presented herein.

The breadth and scope of the present disclosure should not be limited by any of the above-described exemplary implementations, but should be defined only in accordance with the following claims and their equivalents.

What is claimed is:

1. A memory device, comprising:
a conductive layer;
a stack structure comprising interleaved conductive layers and dielectric layers;

a channel structure extending through the stack structure and the conductive layer, the channel structure comprising a memory film and a semiconductor channel;
a doped semiconductor layer in contact with the semiconductor channel, wherein the conductive layer is between the doped semiconductor layer and the stack structure;
an insulating layer, wherein the doped semiconductor layer is between the insulating layer and the conductive layer; and
a source contact extending through the insulating layer and in contact with the doped semiconductor layer.

2. The memory device of claim 1, further comprising a contact structure extending through the doped semiconductor layer outside of the stack structure.

3. The memory device of claim 2, wherein the contact structure is below the conductive layer in a direction facing the stack structure.

4. The memory device of claim 2, further comprising a dielectric layer between the contact structure and the doped semiconductor layer.

5. The memory device of claim 2, further comprising a peripheral contact connected with the contact structure outside of the stack structure.

6. The memory device of claim 1, wherein the conductive layer comprises polysilicon, a high dielectric constant (high-k) dielectric, or a metal.

7. The memory device of claim 1, wherein the doped semiconductor layer comprises a plate and a plug extending from the plate into the channel structure, and the plug is in contact with the semiconductor channel.

8. The memory device of claim 1, wherein the memory film extends beyond the stack structure in a vertical direction and is in contact with the doped semiconductor layer.

9. The memory device of claim 8, wherein the semiconductor channel comprises a doped portion, and a part of the doped portion of the semiconductor channel extends in the stack structure, beyond the stack structure in the vertical direction and into the doped semiconductor layer.

10. The memory device of claim 1, further comprising:
a first bonding layer connected with the semiconductor channel and comprising first bonding contacts and first dielectrics isolating the first bonding contacts;
a second bonding layer comprising second bonding contacts and second dielectrics isolating the second bonding contacts; and
a peripheral circuit connected with the second bonding layer, wherein the first bonding contacts are bonded with the second bonding contacts.

11. The memory device of claim 10, wherein edges of the stack structure define a staircase structure facing the peripheral circuit.

12. A memory device, comprising:
a conductive layer comprising polysilicon;
a stack structure comprising interleaved conductive layers and dielectric layers;
a channel structure extending through the stack structure and the conductive layer, the channel structure comprising a memory film and a semiconductor channel; and
a doped semiconductor layer in contact with the semiconductor channel, wherein the conductive layer is between the doped semiconductor layer and the stack structure; an insulating layer, and the doped semiconductor layer is between the insulating layer and the conductive layer;

a source contact extending through the insulating layer and in contact with the doped semiconductor layer; and a contact structure extending through the insulating layer and the doped semiconductor layer outside of the stack structure.

13. The memory device of claim 12, wherein the doped semiconductor layer comprises a plate and a plug extending from the plate into the channel structure, and the plug is in contact with the semiconductor channel.

14. The memory device of claim 12, wherein the memory film extends beyond the stack structure in a vertical direction and is in contact with the doped semiconductor layer.

15. The memory device of claim 14, wherein the semiconductor channel comprises a doped portion, and a part of the doped portion of the semiconductor channel extends in the stack structure, beyond the stack structure in the vertical direction and into the doped semiconductor layer.

16. A method for forming a memory device, comprising:
    forming a conductive layer above a substrate;
    forming a stack structure above the conductive layer;
    forming a channel structure extending through the stack structure and the conductive layer, the channel structure comprising a memory film and a semiconductor channel;

sequentially removing the substrate and a part of the channel structure extending beyond the conductive layer to expose a part of the semiconductor channel;

forming a doped semiconductor layer in contact with the exposed part of the semiconductor channel; and forming an insulating layer above the doped semiconductor layer.

17. The method of claim 16, further comprising, prior to forming the doped semiconductor layer, doping the exposed part of the semiconductor channel.

18. The method of claim 16, wherein forming the channel structure comprises:
    forming a channel hole extending through the stack structure and the conductive layer; and
    sequentially forming the memory film, the semiconductor channel, and a capping layer in the channel hole.

19. The method of claim 16, further comprising:
    forming a source contact extending through the insulating layer and in contact with the doped semiconductor layer.

20. The method of claim 16, wherein the conductive layer comprises polysilicon, a high dielectric constant (high-k) dielectric, or a metal.

* * * * *